United States Patent
Nomura et al.

[11] Patent Number: 5,884,105
[45] Date of Patent: Mar. 16, 1999

[54] ZOOM COMPACT CAMERA

[75] Inventors: Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[21] Appl. No.: 774,778

[22] Filed: Dec. 30, 1996

[30] Foreign Application Priority Data

| Jan. 26, 1996 | [JP] | Japan | 8-012317 |
| Feb. 14, 1996 | [JP] | Japan | 8-027132 |
| Feb. 14, 1996 | [JP] | Japan | 8-027133 |
| Mar. 14, 1996 | [JP] | Japan | 8-057878 |

[51] Int. Cl.$^6$ .................................................. G03B 17/00
[52] U.S. Cl. ........................... 396/72; 396/349; 396/542
[58] Field of Search .............................. 396/72, 349, 542

[56] References Cited

U.S. PATENT DOCUMENTS

| 4,864,348 | 9/1989 | Fujiwara et al. |
| 5,051,764 | 9/1991 | Nomura et al. |
| 5,079,577 | 1/1992 | Nomura . |
| 5,162,831 | 11/1992 | Haraguchi et al. |
| 5,327,184 | 7/1994 | Nomura et al. |
| 5,349,475 | 9/1994 | Nomura et al. |
| 5,371,569 | 12/1994 | Tanaka . |
| 5,398,163 | 3/1995 | Sano . |
| 5,434,714 | 7/1995 | Kohmoto et al. |
| 5,450,242 | 9/1995 | Kohmoto et al. |
| 5,502,536 | 3/1996 | Amanuma et al. | 396/542 |
| 5,559,571 | 9/1996 | Miyamoto et al. | 396/542 |
| 5,581,412 | 12/1996 | Tanaka . |
| 5,636,063 | 6/1997 | Kohmoto et al. |
| 5,646,790 | 7/1997 | Kohmoto et al. |

FOREIGN PATENT DOCUMENTS

| 0609913 | 6/1989 | European Pat. Off. |
| 0407914 | 1/1991 | European Pat. Off. |
| 4010278 | 10/1990 | Germany . |
| 3219221 | 9/1991 | Japan . |
| 2231974 | 11/1990 | United Kingdom . |
| 2244563 | 12/1991 | United Kingdom . |
| 2244567 | 12/1991 | United Kingdom . |

OTHER PUBLICATIONS

Two United Kingdom Search Reports issued Mar. 11, 1998.
Copy of a French Search Report, dated Dec. 5, 1997.
A United Kingdom Search Report, dated Mar. 25, 1997, with UK Application No. 9701511.9.

Primary Examiner—W. B. Perkey
Attorney, Agent, or Firm—Greenblum & Bernstein, P.L.C.

[57] ABSTRACT

A zoom compact camera arranged such that, during a zooming procedure, the relative amount and speed of movement along the optical axis of a first movable barrel with respect to a second movable barrel are set to be substantially equal to the relative amount and speed of movement along the optical axis of the second movable barrel with respect to a third movable barrel. A linear guide barrel integrally moves with the third movable barrel, and is provided with a lead-in groove that runs parallel to the optical axis and the lead-in groove has a through-hole at the rear thereof. A flexible printed circuit board is arranged such that it extends rearward from an electrical unit, extends around the rear of the second movable barrel, extends inside the lead-in groove on the inner face of the linear guide barrel, extends around the front of the lead-in groove to be fixed to the outer face of the linear guide barrel, further extends along the outer face of the linear guide barrel, and then passes to the inner face of the linear guide barrel via the through-hole.

22 Claims, 28 Drawing Sheets

ZOOM COMPACT CAMERA

BACKGROUND OF THE INVENTION

1. Field of the Invention

The present invention relates to a zoom compact camera. In particular, the present invention relates to a zoom lens barrel structure and flexible printed circuit board that is provided within the zoom lens structure.

2. Background of the Invention

In a lens-shutter type of camera having a zooming function ("zoom compact camera"), a lens barrel, and, in particular, a zoom lens barrel, is often provided with at least one movable barrel that moves away from and toward the camera along the optical axis. If an electrical unit, such as a shutter unit, is housed in the movable barrel, the shutter unit must be connected to the camera in order to receive control signals. Thus, the lens barrel is provided with a flexible printed circuit board (FPC) between the shutter unit and the camera to allow movement of the movable barrel with respect to the camera. However, a problem arises in that, as the movable barrel moves toward the camera, the flexible printed circuit board becomes slack and can interfere with the movement of the barrels or with the light coming through the camera aperture.

One conventional measure to control the above problem is to provide an area for taking-up and paying-out the slack part of the flexible printed circuit board. However, this method requires an extra mechanism for taking-up or paying-out the slack or requires extra space for storage of the slack.

Another measure is to provide a flexible printed circuit board that is formed with a spiral spring-like shape that is arranged around the inner diameter of the lens barrel such that, as the movable barrel extends, the flexible printed circuit board expands like a spring, and as the movable barrel retracts, the flexible printed circuit board also retracts like a spring under compression. However, this method requires that the lens barrel have a diameter that is sufficient to accommodate the flexible printed circuit board such that the flexible printed circuit board does not interfere with the light coming through the camera aperture.

SUMMARY OF THE INVENTION

It is therefore an object of the present invention to provide an improved zoom compact camera in which an electrical unit in a movable barrel can be connected to a control unit at the camera body in a simple and compact way.

According to one aspect of the invention, there is provided a zoom compact camera that includes a camera body, a first movable barrel, a second movable barrel, a housing, an electrical unit (such as a shutter unit) mounted on the first movable barrel, and a flexible printed circuit board for connecting the electrical unit with a control unit at the camera body.

The first movable barrel and the second movable barrel are concentrically arranged to telescope during zooming and the housing guides the second movable barrel. The flexible printed circuit board is arranged such that it extends with a predetermined length from the electrical unit around a rear end of the second movable barrel to the front of the housing.

The camera is further arranged such that, during movement of the first movable barrel, the second movable barrel and the third movable barrel, the relative amount and speed of movement along the optical axis of the first movable barrel with respect to the second movable barrel are set to be substantially equal to the relative amount and speed of movement along the optical axis of the second movable barrel with respect to the housing.

If the movable barrels move in this exemplary manner, the shape of the flexible printed circuit board adjusts without slacking. That is, as the shutter unit moves forward with the movement of the first movable barrel of the flexible printed circuit board is pulled forward. However, since the first movable barrel is moved relative to the second movable barrel at the same rate that the second movable barrel is moved relative to the housing, an equivalent amount of the flexible printed circuit board is fed from the part of the flexible printed circuit board that runs between the second movable barrel and the housing. Thus, slacking of the flexible printed circuit board is prevented and there is no need to provide a receiving part for receiving the slack, providing a more compact camera.

In particular, if a spring support is provided at the rear end of the second movable barrel, such that the spring support supports the flexible printed circuit board and urges the flexible printed circuit board rearward, the flexible printed circuit board will be guided with no slack.

Alternatively, where the second movable barrel houses a linear guide member that moves integrally with the second movable barrel along the optical axis, the linear guide member may be provided with the spring support.

In a particular exemplary structure, the housing is formed as a third movable barrel that houses a linear guide barrel that moves integrally with the third movable barrel along the optical axis. An inner face of the linear guide barrel is provided with a lead-in groove that extends parallel to the optical axis for receiving the flexible printed circuit board. The use of a lead-in groove ensures that the flexible printed circuit board does not interfere with the movements of various parts in the lens barrel.

In another exemplary structure, a through-hole is formed at a rear part of the lead-in groove, and a portion of the flexible printed circuit board is arranged such that it extends around a rear end of the second movable barrel, extends forwardly inside the lead-in groove, extends around a front of the lead-in groove, extends rearwardly along an outer face of the linear guide barrel, and extends through the through-hole to the inner face of the linear guide barrel. This arrangement further secures the flexible printed circuit board in position to ensure that the flexible printed circuit board does not interfere with the movement of various parts in the camera and minimizes the amount of space used by the flexible printed circuit board.

Preferably, in all of the above-noted exemplary structures, the movement speeds of the first movable barrel and the second movable barrel are respectively varied in a linear manner.

Additionally, in all of the above exemplary structures, the flexible printed circuit board may be secured at or near the front of the housing, and may be secured to the housing (the third movable barrel) or the outer face of the linear guide barrel by, for example, double-sided tape.

In another preferred embodiment, the zoom compact camera includes a camera body, a movable lens barrel, an electrical unit (such as a shutter unit), a flexible printed circuit board for providing an electrical link between the electrical unit and a control unit at the camera body, and a fixed lens barrel that supports the movable lens barrel in a manner enabling movement of the movable lens barrel along the optical axis.

In particular, the flexible printed circuit board has at least one annular ring portion with a predetermined inner diameter.

In a preferred arrangement, the annular ring portion includes two annular rings that have an electrical connection at a first position on a circumferential edge thereof. In this case, the two annular rings are attached at one side but can separate at an opposite side such that the annular rings expand and contract in a bellows-like manner when the movable lens barrel moves forward and rearward, respectively, along the optical axis.

With this arrangement, the two annular rings fold and unfold in coordination with the movement of the movable barrel such that there is no slack in the flexible printed circuit board. Further, the use of an annular arrangement allows circuit patterns in the flexible printed circuit board to be split into two paths around the semi-circular halves of the annular portion such that the width of the annular portion is half of the width of the other portions of the flexible printed circuit board. Thus, the annular portion does not interfere with the light entering the camera aperture.

In a particular exemplary structure, the flexible printed circuit board may further include a first rectilinear part and a second rectilinear part. The first rectilinear portion has an electrical connection to one of the two annular rings at a second position opposite to the first position and the second rectilinear portion has an electrical connection to the other of the two annular rings at a corresponding third position on the other of the two annular rings. With this arrangement, the two annular rings are supported by the first rectilinear portion and the second rectilinear portion and are folded and unfolded, as described above, by the movement of the first rectilinear portion and the second rectilinear portion.

DETAILED DESCRIPTION OF THE PREFERRED EMBODIMENTS

Preferred embodiments of a lens-shutter type of camera having a zooming function (referred to as a "zoom compact camera" or a "zoom lens camera") will be described below.

Figure 11:
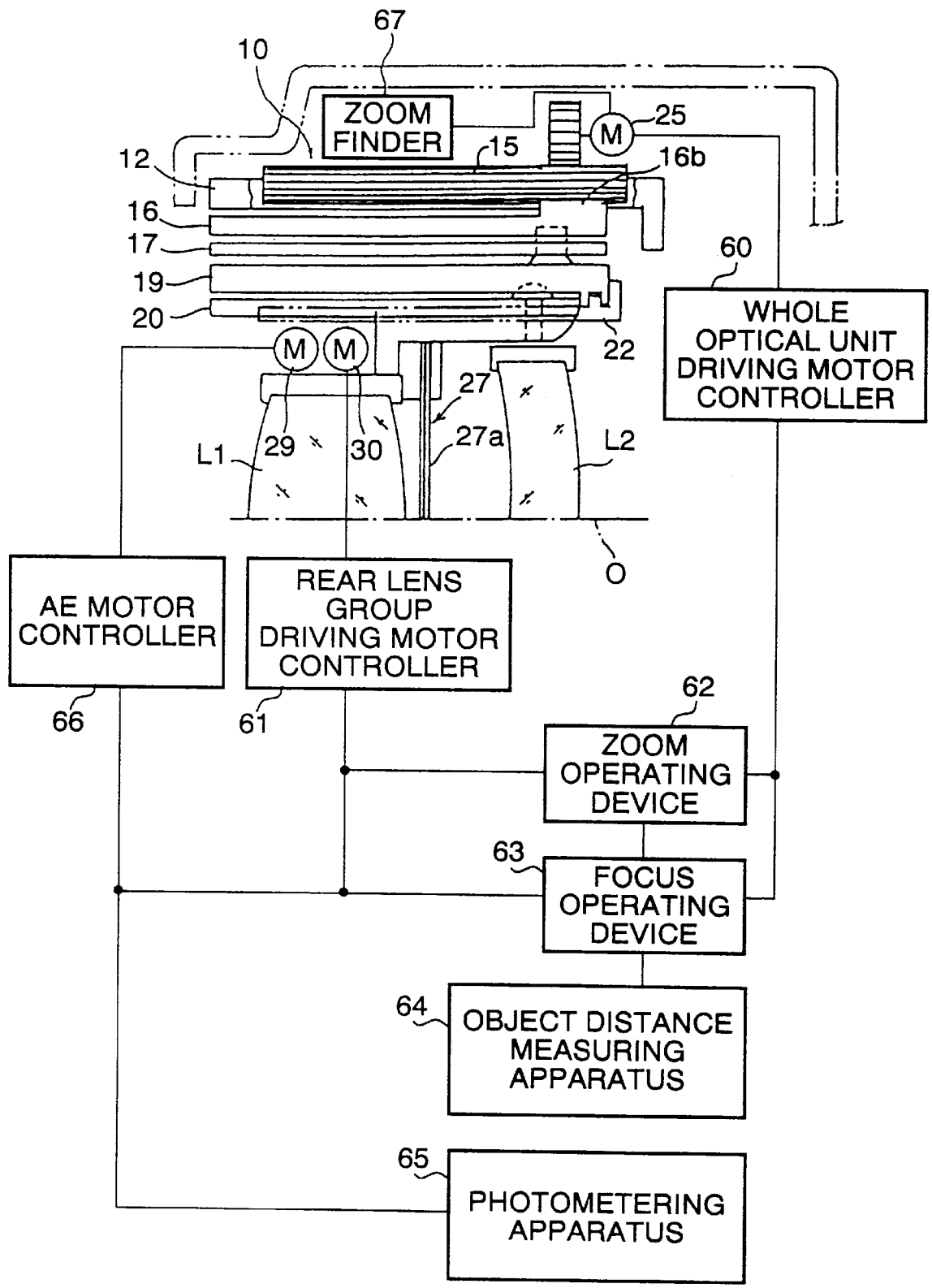
FIG. 11 is a block diagram of a controlling system for controlling an operation of the zoom lens barrel.

The concept of the zoom lens camera will now be described with reference to FIG. 11. FIG. 11 is a schematic representation of various elements which comprise a zoom lens camera.

The zoom lens camera is provided with a three-stage delivery-type zoom lens barrel 10 having three movable barrels, namely a first movable barrel 20, a second movable barrel 19 and a third movable barrel 16, which are concentrically arranged in this order from an optical axis O. In the zoom lens barrel 10, two lens groups are provided, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used. Similarly, a photometering system as disclosed in the above-noted U.S. patent application Ser. No. 08/605,759 could be implemented as photometering apparatus 65.

The zoom operative device 62 may comprise as, for example, a manually-operable zoom operating lever (not shown) provided on the camera body or a pair of zoom buttons, e.g., a "wide" zoom button and a "tele" zoom button, (not shown) provided on the camera body. When the zoom operating device 62 is operated, the whole optical unit driving motor controller 60 drives a whole optical unit driving motor 25 to move the front lens group L1 and the rear lens group L2, rearwardly or forwardly. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies sequentially to the variation of the focal length through the operation of the zoom operating device 62. Therefore, the photographer may perceive the variation of the set focal length through the operation of the zoom operating device 62, by observing the variation of image magnification of the visual field of the finder. In addition, the focal length, set by the operation of the zoom operating device 62, may be indicated as a value on an LCD (liquid crystal display) panel (not shown) or the like.

When the focus operating device 63 is operated, the whole optical unit driving motor controller 60 drives the whole optical unit driving motor 25. At the same time the rear lens group driving motor controller 61 drives a rear lens group driving motor 30. The driving of the whole optical unit driving motor controller 60 and the rear lens group driving motor controller 61, moves the front and rear lens groups L1 and L2 to respective positions corresponding to a set focal length and a detected object distance, such that the zoom lens is focused on the object.

Specifically, the focus operating device 63 is provided with a release button (not shown) provided on an upper wall of the camera body. A photometering switch and a release switch (both not shown) are synchronized with the release button. When the release button is half-depressed (half-step), the photometering switch is turned ON, and the object distance measuring and photometering commands are respectively input to the object distance measuring apparatus 64 and the photometering apparatus 65.

When the release button is fully depressed (full step), the release switch is turned ON, and according to the result of object distance measuring command and a set focal length, the whole optical unit driving motor 25 and the rear lens group driving motor 30 are driven. In addition, the focusing operation, in which the front lens group L1 and the rear lens group L2 move to the focusing position, is executed. Further, an AE motor 29 of an AF/AE (i.e., autofocus/autoexposure) shutter unit (FIG. 9) is driven via the AE motor controller 66 to actuate a shutter 27. During the shutter action, the AE motor controller 66 drives the AE motor 29 to open shutter blades 27a of the shutter 27 for a specified period of time according to the photometering information output from the photometering apparatus 65.

When the zoom operating device 62 is operated, the zoom operating device 62 drives the whole optical unit driving motor 25 to move the front and rear lens groups L1 and L2 together as a whole along the optical axis O (optical axis direction). Simultaneous with such a movement, the rear lens group driving motor 30 may also be driven via the rear lens group driving motor controller 61 to move the rear lens group L2 relatively with respect to the first lens group L1. However, this above-described operation is not performed under the conventional concept of zooming, in which the focal length is varied sequentially while maintaining an in-focus condition. When the zoom operating device 62 is operated, the front lens group L1 and the rear lens group L2 move in the optical axis direction, without varying the distance therebetween, by driving only the whole optical unit driving motor 25.

During the zooming operation, an in-focus condition cannot be maintained at all times with respect to an object located at a specific distance. However, this is not a problem in a lens-shutter type camera, since the image of the object is not observed through the photographing optical system, but rather through the finder optical system, that is provided separate from the photographing optical system. Thus, it is sufficient that the in-focus condition is obtained when the shutter is released. Accordingly, when the release button is fully depressed, the focusing operation (focus adjusting operation) is carried out by moving at least one of the whole optical unit driving motor 25 and the rear lens group driving motor 30. In such a manner, when the focus operating device 63 is operated and since each of the two lens groups L1, L2 can be driven independently, the position of the lens groups L1, L2 can be flexibly controlled.

An embodiment of the zoom lens barrel according to the above concept will be described with reference to mainly FIGS. 9 and 10.

The overall structure of the zoom lens barrel 10 will now be described.

The zoom lens barrel 10 is provided with the first movable barrel 20, the second movable barrel 19, the third movable barrel 16, and a fixed lens barrel block 12. The third movable barrel 16 engages a cylindrical portion 12p of the fixed lens barrel block 12, and moves along the optical axis O upon being rotated. A linear guide barrel 17 is provided on an inner periphery of the third movable barrel 16 which is rotationally restricted. The linear guide barrel 17 and the third movable barrel 16 move together as a whole along the optical axis O, with the third movable barrel 16 rotating relative to the linear guide barrel 17. The first movable barrel 20 moves along the optical axis O and is rotationally restricted. The second movable barrel 19 rotatably moves relative to the linear guide barrel 17 and the first movable barrel 20 along the optical axis O. The whole optical unit driving motor 25 is secured to the fixed lens barrel block 12. A shutter mounting stage 40 is secured to the first movable barrel 20. The AE motor 29 and the rear lens group driving motor 30 are mounted on the shutter mounting stage 40. The front lens group L1 and the rear lens group L2 are respectively supported by a lens supporting barrel (lens supporting annular member) 34 and a lens supporting barrel 50.

The fixed lens barrel block 12 is fixed in front of an aperture plate 14 fixed to the camera body. The aperture plate 14 is provided on a center thereof with a rectangular-shaped aperture 14a which forms the limits of each exposed frame. The fixed lens barrel block 12 is provided, on an inner periphery of the cylindrical portion 12p thereof, with a female helicoid 12a, and also a plurality of linear guide grooves 12b each extending parallel to the optical axis O, i.e., extending in the optical axis direction. At the bottom of one of the linear guide grooves 12b, namely 12b', a code plate 13a, having a predetermined code pattern, is fixed. The code plate 13a extends in the optical axis direction and extends substantially along the whole of the length of the fixed lens barrel block 12. The code plate 13a is part of a flexible printed circuit board 13 positioned outside the fixed lens barrel block 12.

Figure 7:
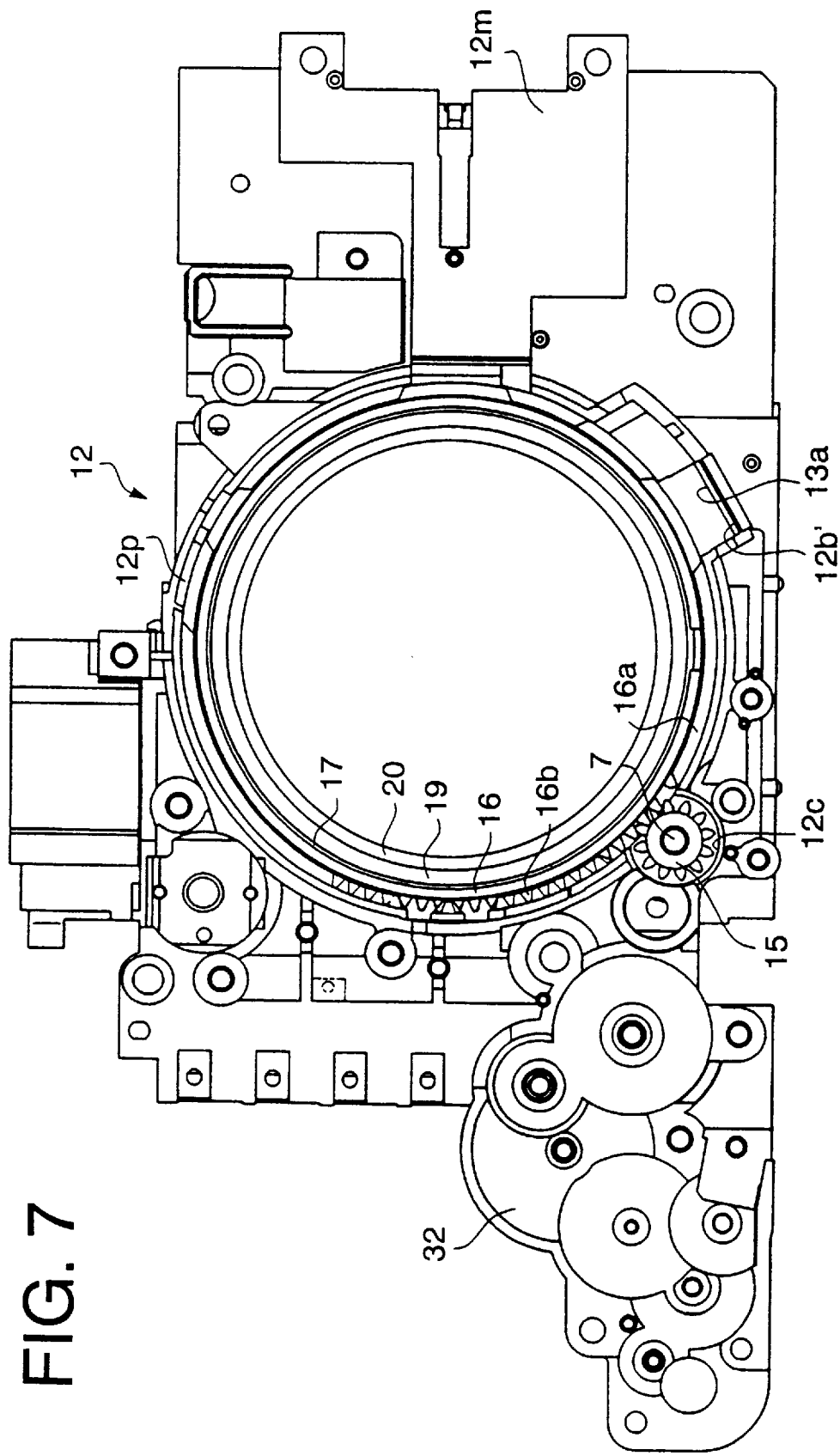
FIG. 7 is a front elevational view of a fixed lens barrel block of the zoom lens barrel.
Figure 10:
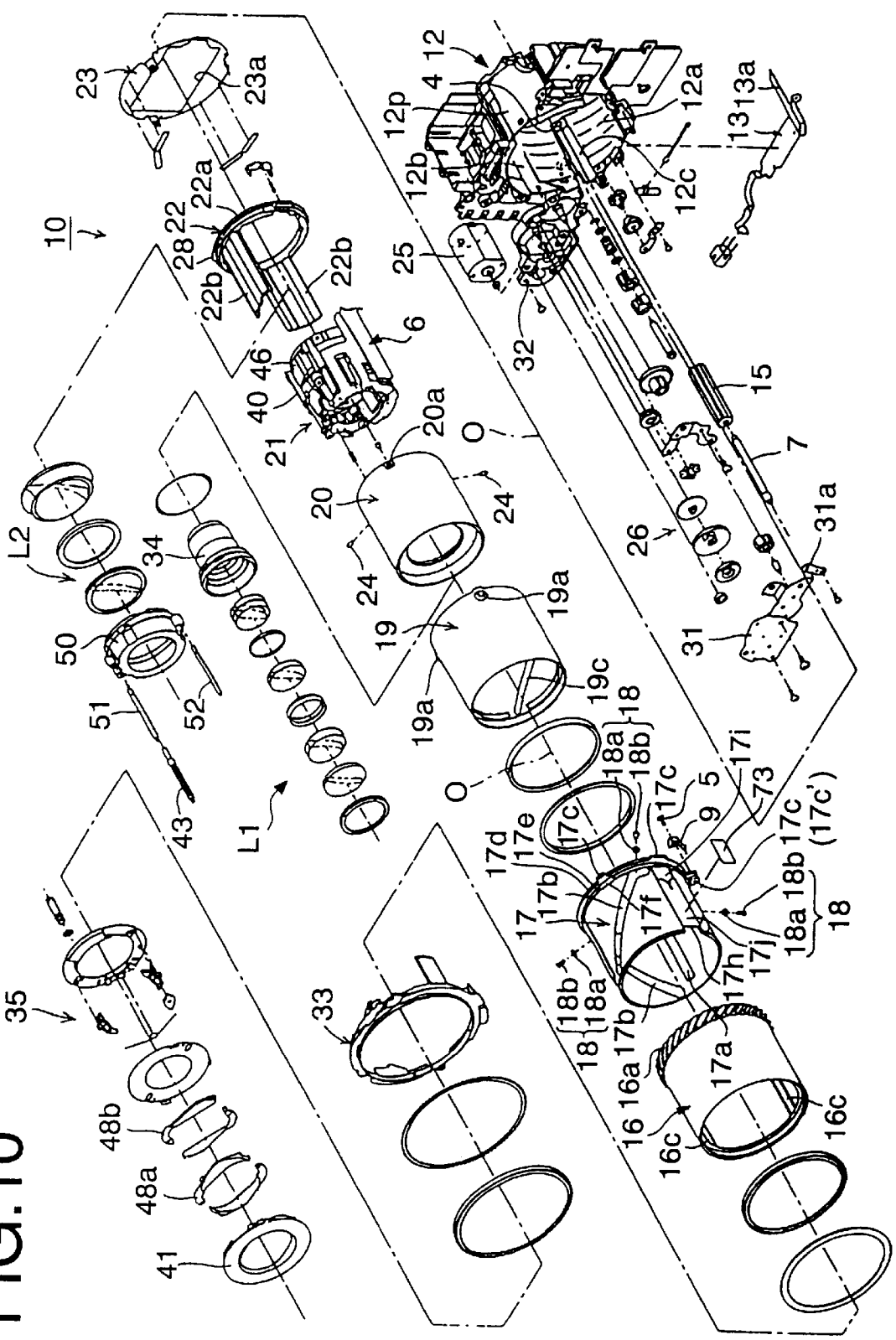
FIG. 10 is an exploded perspective view of the overall structure of the zoom lens barrel.

A gear housing 12c is provided as shown in FIGS. 7 or 10 in the fixed lens barrel block 12. The gear housing 12c is recessed outwardly from an inner periphery of the cylindrical portion 12p of the fixed lens barrel block 12 in a radial direction while extending in the optical axis direction. In the gear housing 12c, a driving pinion 15, extending in the optical axis direction, is rotatably positioned. Both ends of an axial shaft 7 of the driving pinion 15 are rotatably supported by a supporting hollow 4, which is provided in the fixed lens barrel block 12, and a supporting hollow 31a, which is provided on a gear supporting plate 31 fixed on the fixed lens barrel block 12 by set screws (not shown), respectively. Part of the teeth of the driving pinion 15 project inwardly from the inner periphery of the cylindrical portion of the fixed lens barrel block 12, so that the driving pinion 15 meshes with an outer peripheral gear 16b of the third movable barrel 16, as shown in FIG. 7.

Figure 6:
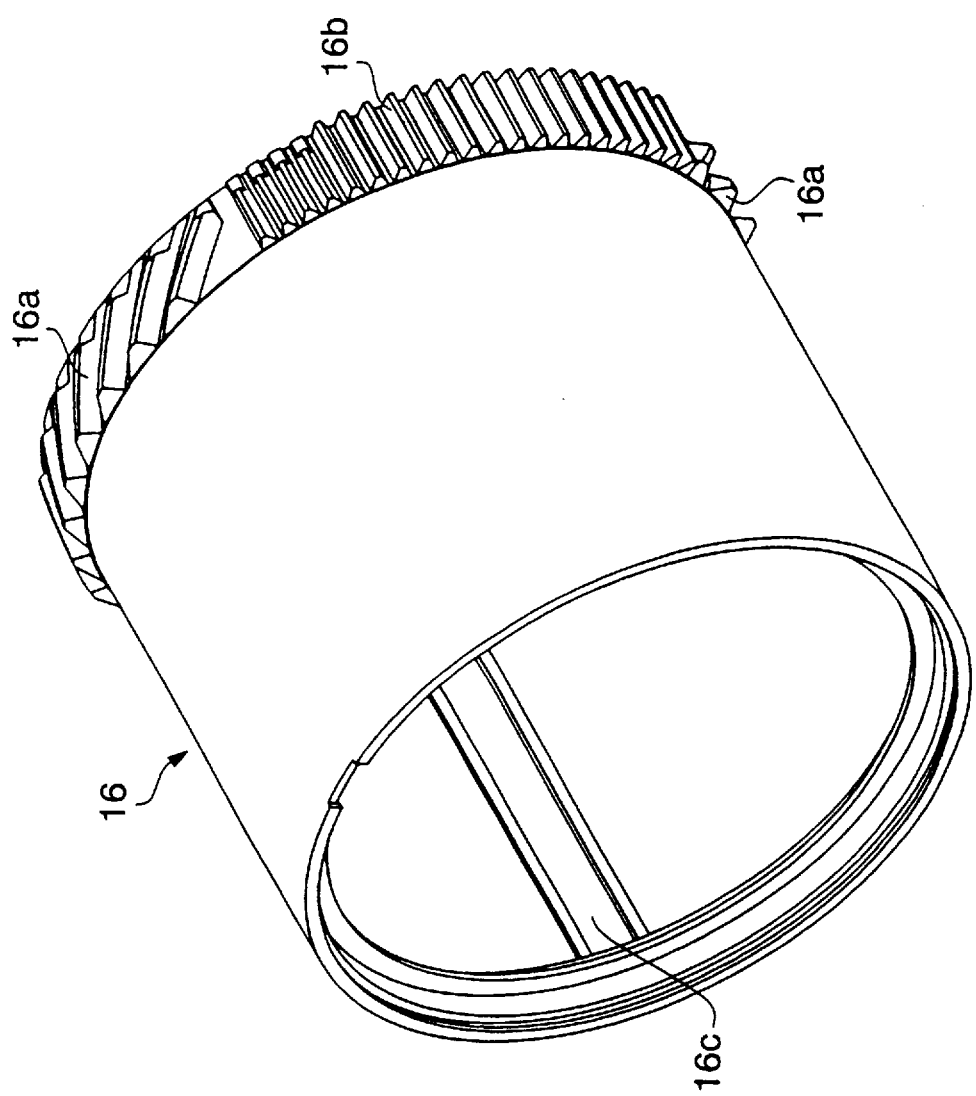
FIG. 6 is an external schematic perspective view of a third movable barrel of the zoom lens barrel.

A plurality of linear guide grooves 16c are formed on an inner periphery of the third movable barrel 16, each of which extends parallel to the optical axis O. At an outer periphery of the rear end of the third movable barrel 16, a male helicoid 16a and the aforementioned outer peripheral gear 16b are provided as shown in FIG. 6. The male helicoid 16a engages with the female helicoid 12a of the fixed lens barrel block 12. The outer peripheral gear 16b engages with the driving pinion 15. The driving pinion 15 has an axial length sufficient to engage with the outer peripheral gear 16b throughout the entire range of movement of the third movable barrel 16 in the optical axis direction.

As shown in FIG. 10, the linear guide barrel 17 is provided with a rear end flange 17d on a rear part of an outer periphery. The rear end flange 17d has a plurality of engaging projections 17c each projecting away from the optical axis O in a radial direction. The linear guide barrel 17 is further provided with an anti-dropping flange 17e in front of the rear end flange 17d. A circumferential groove 17g is formed between the rear end flange 17d and the anti-dropping flange 17e. The anti-dropping flange 17e has a radius which is smaller than the rear end flange 17d. The anti-dropping flange 17e is provided with a plurality of cutout portions 17f. Each of the cutout portions 17f allows a corresponding engaging projection 16d to be inserted into the circumferential groove 17g, as shown in FIG. 9.

The third movable barrel 16 is provided with a plurality of engaging projections 16d on an inner periphery of the rear end thereof. Each of the engaging projections 16d projects towards the optical axis O in a radial direction. By inserting the engaging projections 16d into the circumferential groove 17g, through the corresponding cutout portions 17f, the engaging projections 16d are positioned in the circumferential groove 17g between the flanges 17d and 17e (see FIG. 9). By rotating the third movable barrel 16 relative to the linear guide barrel 17, the engaging projections 16d are engaged with the linear guide barrel 17.

An aperture plate 23 having a rectangular-shaped aperture 23a approximately the same shape as the aperture 14a is fixed on the rear end of the linear guide barrel 17.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis O.

A contacting terminal 9 is fixed to one of the engaging projections 17c, in particular projection 17c'. The contacting terminal 9 is in slidable contact with the code plate 13a, fixed to the bottom of the linear guide groove 12b', to generate signals corresponding to focal length information during zooming. On the inner periphery of the linear guide barrel 17 a plurality of linear guide grooves 17a are formed, each extending parallel to the optical axis O. A plurality of lead slots 17b are also formed on the linear guide barrel 17 as shown in FIG. 10. The lead slots 17b are each formed oblique (inclined) to the optical axis O.

The second movable barrel 19 engages with the inner periphery of the linear guide barrel 17. A plurality of lead grooves 19c are provided on the inner periphery of the second movable barrel 19, in a direction inclined oppositely to the lead slots 17b. A plurality of follower projections 19a are provided On the outer periphery of the rear end of the second movable barrel 19. Each of the follower projections 19a has a trapezoidal cross-sectional shape projecting away from the optical axis O in a radial direction. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third movable barrel 16. With such an arrangement, when the third movable barrel 16 rotates, the second movable barrel 19 rotates while moving linearly in the optical axis direction.

The first movable barrel 20 is engaged to the inner periphery of the second movable barrel 19. A plurality of follower pins 24 are provided on an outer periphery of the rear of the first movable barrel 20, each engaging with the corresponding inner lead groove 19c. In addition, the first movable barrel 20 is guided linearly by a linear guide member 22. The first movable barrel 20 is provided at the front end thereof with a decorative plate 41.

Figure 1:
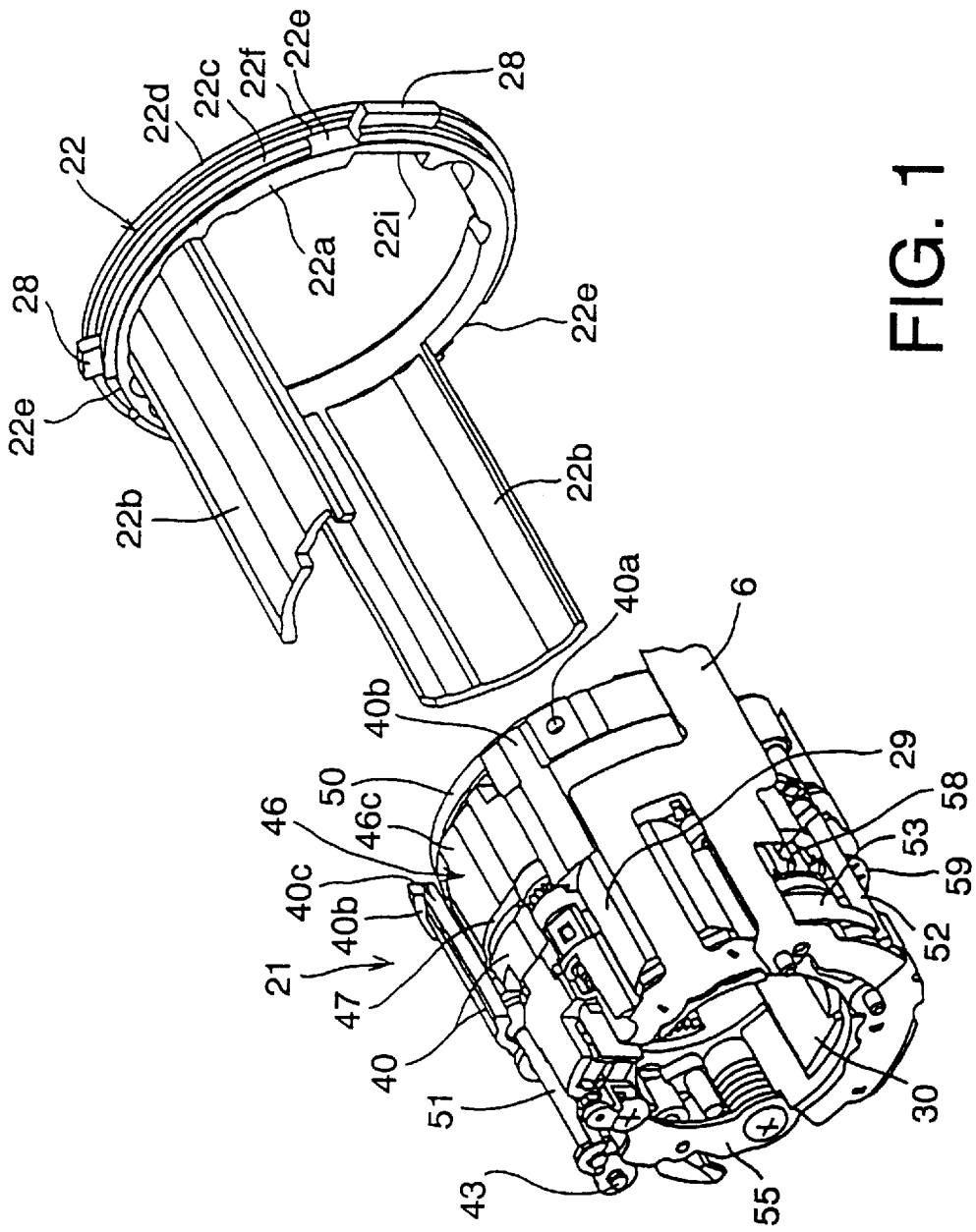
FIG. 1 is an enlarged schematic perspective view showing a part of a zoom lens barrel.
Figure 2:
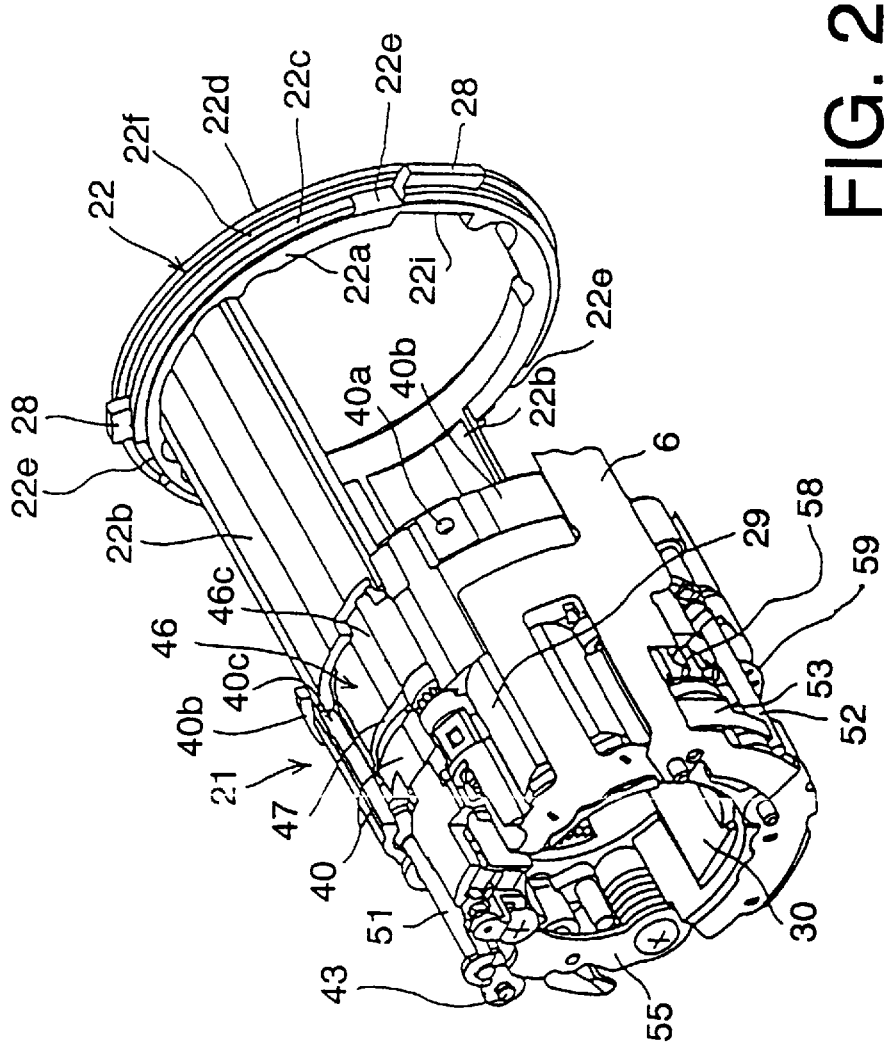
FIG. 2 is a schematic perspective view showing the part of the zoom lens barrel shown in FIG. 1 in an engaged state.
Figure 3:
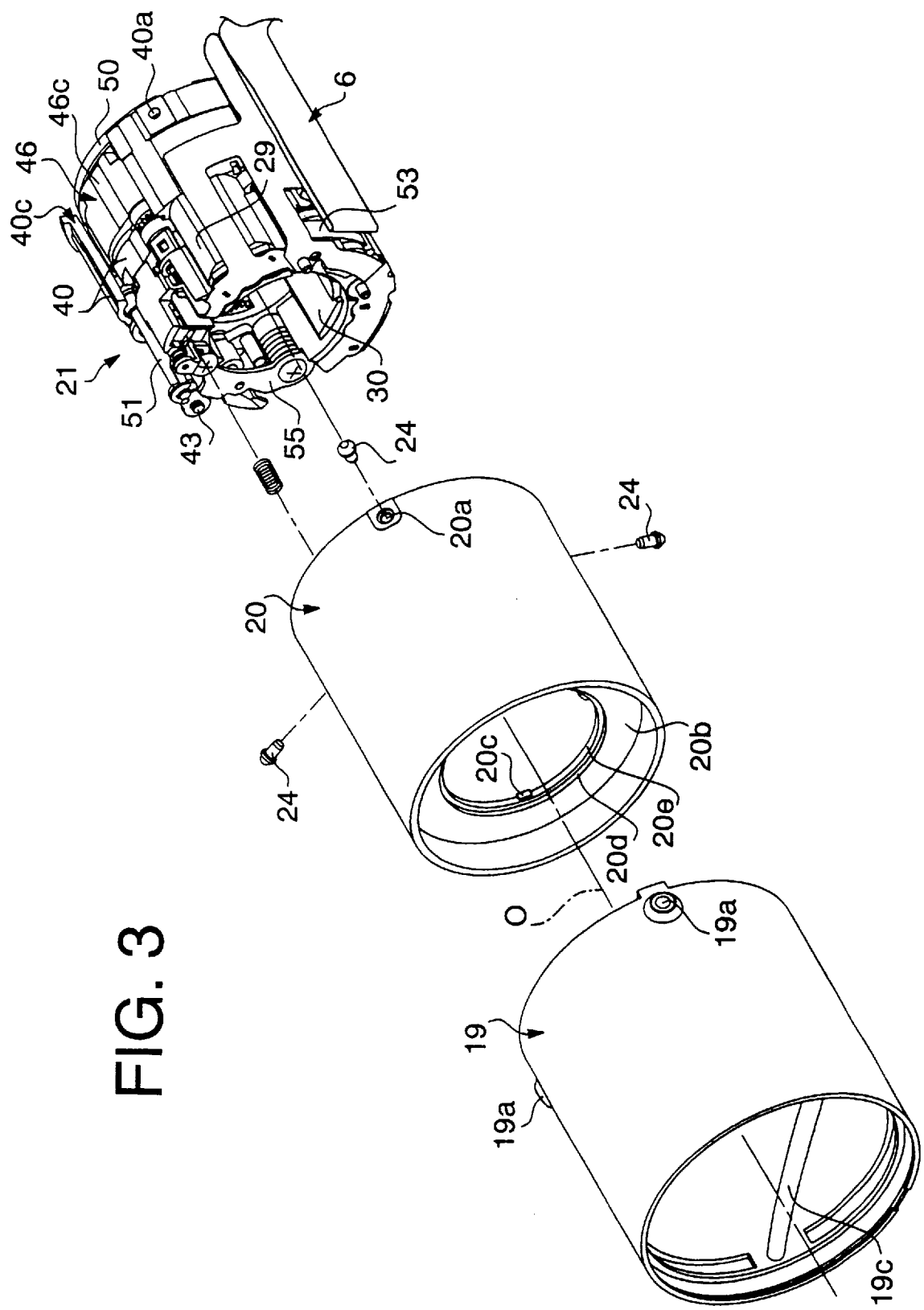
FIG. 3 is an enlarged exploded perspective view showing a part of the zoom lens barrel.

As shown in FIGS. 1 and 2, the linear guide member 22 is provided with an annular member 22a, a pair of guide legs 22b and a plurality of engaging projections 28. The pair of guide legs 22b project from the annular member 22a in the optical axis direction. The plurality of engaging projections 28 each project from the annular member 22a away from the optical axis O in a radial direction. The engaging projections 28 slidably engage with the linear guide grooves 17a. The guide legs 22b are respectively inserted into linear guides 40c between the inner peripheral surface of the first movable barrel 20 and the AF/AE shutter unit 21.

The annular member 22a of the linear guide member 22 is connected to the rear of the second movable barrel 19, such that the linear guide member 22 and the second movable barrel 19 move along the optical axis O as a whole, and in addition are capable of relatively rotating with respect to each other around the optical axis O. The linear guide member 22 is further provided, on the outer periphery of the rear end thereof, with a rear end flange 22d. The linear guide member 22 is also provided with an anti-dropping flange 22c in front of the rear end flange 22d. A circumferential groove 22f is formed between the rear end flange 22d and the anti-dropping flange 22c. The anti-dropping flange 22c has a radius which is smaller than the rear end flange 22d. As shown in FIGS. 1 or 2, the anti-dropping flange 22c is provided with a plurality of cutout portions 22e, each allowing a corresponding engaging projection 19b to be inserted into the circumferential groove 22f (see FIG. 9).

A plurality of engaging projections 19b, each projecting towards the optical axis O in a radial direction are provided on an inner periphery of the rear end of the second movable barrel 19. By inserting the engaging projections 19b into the circumferential groove 22f through the corresponding cutout portions 22e, the engaging projections 19b are positioned in the circumferential groove 22f between the flanges 22c and 22d. By rotating the second movable barrel 19 relative to the linear guide member 22, the engaging projections 19b are engaged with the linear guide member 22. With the above structure, when the second movable barrel 19 rotates in the forward or reverse rotational direction, the first movable barrel 20 moves linearly, forwardly or rearwardly along the optical axis O, but is restricted from rotating.

Figure 8:
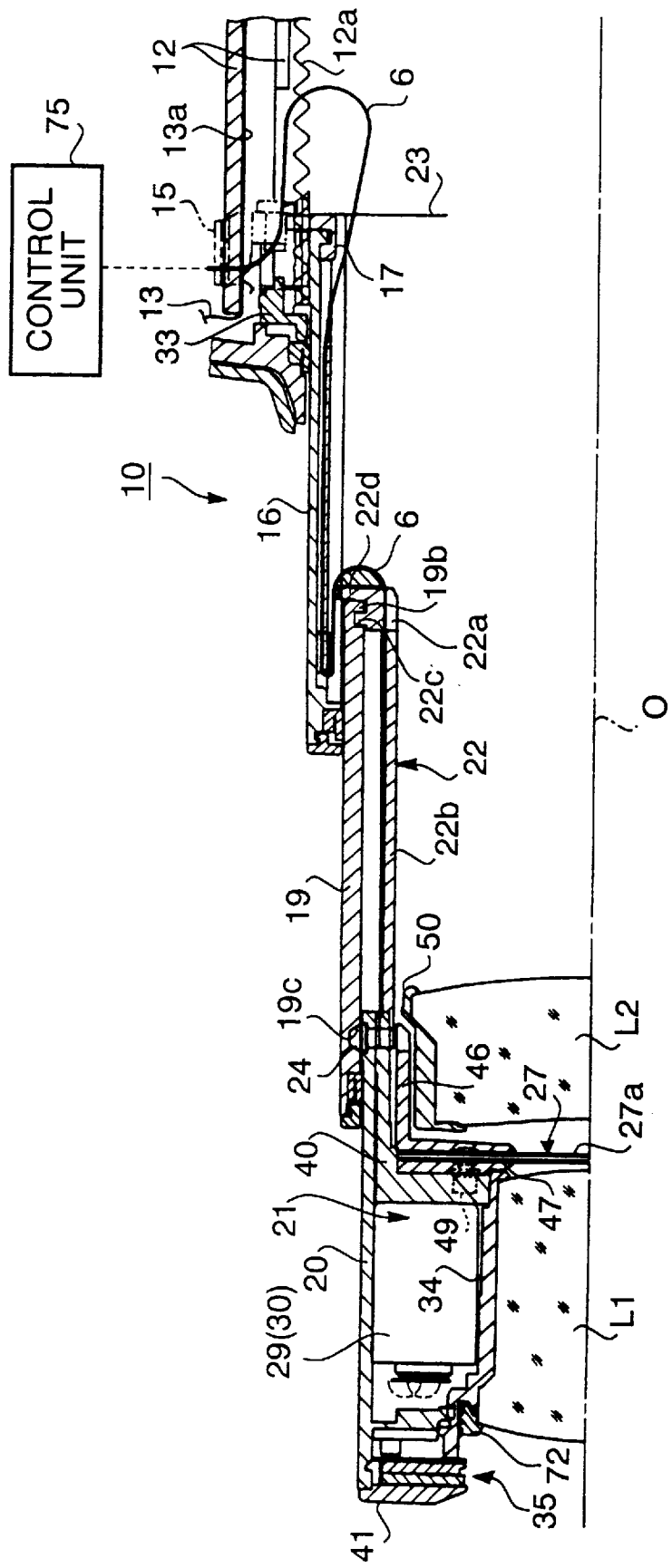
FIG. 8 is a sectional view of an upper part of the zoom lens barrel in a maximum extended state.

A barrier apparatus 35 having barrier blades 48a and 48b is mounted to the front of the first movable barrel 20. On an inner peripheral face of the first movable barrel 20 the AF/AE shutter unit 21 is engaged and fixed, as shown in FIG. 8. The AF/AE shutter unit 21 includes the shutter 27, which consists of three shutter blades 27a The AF/AE shutter unit 21 is provided with a plurality of fixing holes 40a formed at even angular intervals on the outer periphery of the shutter mounting state 40. Only one of the fixing holes 40a appears in each of FIGS. 1–5.

Figure 4:
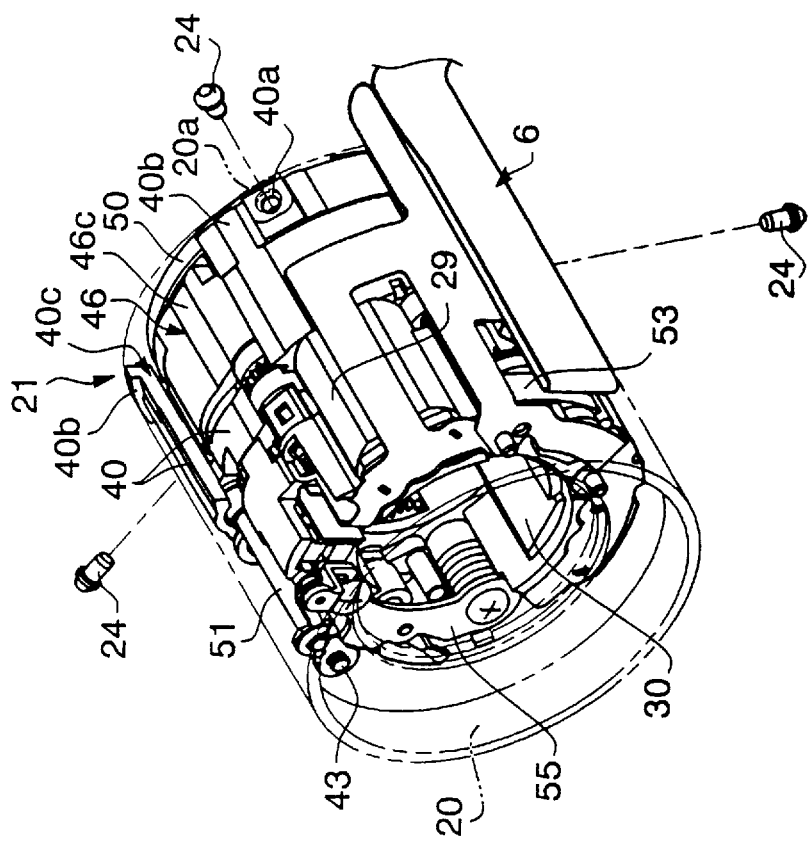
FIG. 4 is a schematic perspective view illustrating a state where an AF/AE shutter unit of the zoom lens barrel is mounted to a first movable barrel.

The aforementioned plurality of follower pins 24, which engage with the inner lead grooves 19c, also serve as device for fixing the AF/AE shutter unit 21 to the first movable barrel 20. The follower pins 24 are inserted and fixed in holes 20a, formed on the first movable barrel 20, and in the fixing holes 40a. With this arrangement the AF/AE shutter unit 21 is secured to the first movable barrel 20 as shown in FIG. 4. In FIG. 4 the first movable barrel 20 is indicated by phantom lines. The follower pins 24 may be fixed by an adhesive, or the pins 24 may comprise as screws which are screwed into the fixing holes 40a.

Figure 5:
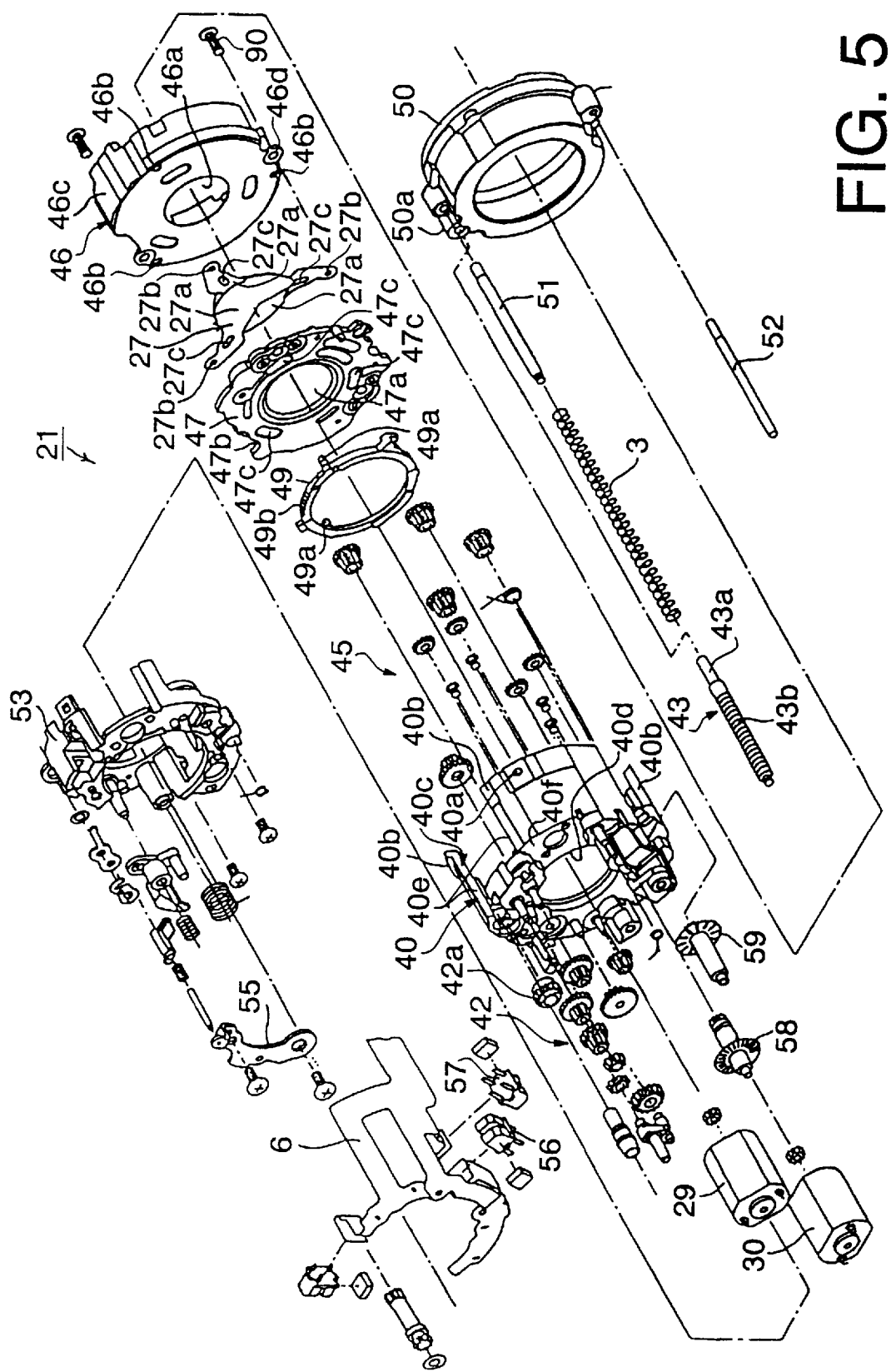
FIG. 5 is an exploded perspective view illustrating main parts of the AF/AE shutter unit of the zoom lens barrel.

As illustrated in FIGS. 5 and 10, the AF/AE shutter unit 21 is provided with the shutter mounting state 40, a shutter blade supporting ring 46 which is fixed on the rear of the shutter mounting stage 40 so as to be located inside the shutter mounting stage 40, and the lens supporting barrel 50 supported such that it is movable relative to the shutter mounting stage 40. The lens supporting barrel 34, the AE motor 29, and the rear lens group driving motor 30, are supported on the shutter mounting stage 40. The shutter mounting stage 40 is provided with an annular member 40f having a circular aperture 40d. The shutter mounting stage 40 is also provided with three legs 40b which project rearwardly with respect to the camera body from the annular member 40f. Three slits are defined between the three legs 40b. Two of the slits comprise the aforementioned linear guides 40c, which slidably engage with the respective pair of guide legs 22b of the linear guide member 22, so as to guide the movement of the linear guide member 22.

The shutter mounting stage 40 supports an AE gear train 45 which transmits a rotation of the AE motor 29 to the shutter 27, a lens driving gear train 42 which transmits rotation of the rear lens group driving motor 30 to a screw shaft 43, photo-interrupters 56, 57a and 57b which are connected to a flexible printed circuit board 6, and rotating disks 58, 59a and 59b, having a plurality of radially formed slits provided in the circumferential direction. An encoder for detecting whether the rear lens group driving motor 30 is rotating and for detecting an amount of rotation of the rear lens group driving motor 30 consists of the photo-interrupters 57a, 57b and the rotating disks 59a, 59b. An AE motor encoder for detecting whether the AE motor 29 is rotating and for detecting an amount of rotation of the AE motor 29 consists of the photo-interrupter 56 and the rotating disk 58.

The shutter 27, a supporting member 47 which pivotally supports the three shutter blades 27a of the shutter 27, and a circular driving member 49, which provides rotative power to the shutter blades 27a, are positioned between the shutter mounting stage 40 and the shutter blade supporting ring 46, secured to the shutter mounting stage 40. The circular driving member 49 is provided with three operating projections 49a at even angular intervals, which respectively engage with each of the three shutter blades 27a. As shown in FIG. 5, the shutter blade supporting ring 46 is provided, at a front end thereof, with a circular aperture 46a and with three supporting holes 46b positioned at even angular intervals around the circular aperture 46a. Two deflection restricting surfaces 46c are formed on the outer periphery of the shutter blade supporting ring 46. Each deflection restricting surface 46c is exposed outwardly from the corresponding linear guide 40c and slidably supports the inner peripheral face of the corresponding guide leg 22b.

The supporting member 47, positioned in front of the shutter blade supporting ring 46, is provided with a circular aperture 47a, aligned with the circular aperture 46a of the shutter blade supporting ring 46, and with three pivotal shafts 47b (only one of which is illustrated in FIG. 10) at respective positions opposite the three supporting holes 46b. Each shutter blade 27a is provided at one end thereof with a hole 27b into which the corresponding pivotal shaft 47b is inserted, such that each shutter blade 27a is rotatable about the corresponding pivotal shaft 47b. The major part of each shutter blade 27a, that extends normal to the optical axis O from the pivoted end, is formed as a light-interceptive portion. All three light-interceptive portions of the shutter blades 27a together prevent ambient light, which enters the front lens group L1, from entering the circular apertures 46a and 47a when the shutter blades 27a are closed. Each shutter blade 27a is further provided, between the hole 27b and the light-interceptive portion thereof, with a slot 27c, through which the corresponding operating projection 49a is inserted. The supporting member 47 is fixed to the shutter blade supporting ring 46 in such a manner that, each shaft 47b, which supports the corresponding shutter blade 27a, is engaged with the corresponding supporting hole 46b of the shutter blade supporting ring 46.

A gear portion 49b is formed on a part of the outer periphery of the circular driving member 49. The gear portion 49b meshes with one of the plurality of gears in the gear train 45 to receive the rotation force from the gear train 45. The supporting member 47 is provided, at respective positions close to the three pivotal shafts 47b, with three arc grooves 47c each arched along a circumferential direction. The three operating projections 49a of the circular driving ring 49 engage with the slots 27c of the respective shutter blades 27a through the respective arc grooves 47c. The shutter blade supporting ring 46 is inserted from the rear of the shutter mounting stage 40, to support the circular driving ring 49, the supporting member 47 and the shutter 27, and is fixed on the shutter mounting stage 40 by set screws 90 respectively inserted through holes 46*d* provided on the shutter blade supporting ring 46.

Behind the shutter blade supporting ring 46, the lens supporting barrel 50, supported to be able to move relative to the shutter mounting stage 40 via guide shafts 51 and 52, is positioned. The shutter mounting stage 40 and the lens supporting barrel 50 are biased in opposite directions away from each other by a coil spring 3 fitted on the guide shaft 51, and therefore play between the shutter mounting stage 40 and the lens supporting barrel 50 is reduced. In addition, a driving gear 42*a*, provided as one of the gears in the gear train 42, is provided with a female thread hole (not shown) at the axial center thereof, and is restricted to move in the axial direction. The screw shaft 43 one end of which is fixed to the lens supporting barrel 50, engages with the female thread hole of the driving gear 42*a*. Accordingly, the driving gear 42*a* and the screw shaft 43 together constitute a feed screw mechanism. In such a manner, when the driving gear 42*a* rotates forwardly or reversely due to driving by the rear lens group driving motor 30, the screw shaft 43 moves forwardly or rearwardly with respect to the driving gear 42*a*, and therefore the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws (not shown). The motors 29, 30 and the photo-interrupters 56, 57*a* and 57*b* are connected to the flexible printed circuit board 6. One end of the flexible printed circuit board 6 is fixed to the shutter mounting stage 40.

After the first, second and third movable barrels 20, 19 and 16, and the AF/AE shutter unit 21, etc. are assembled, the aperture plate 23 is fixed to the rear of the linear guide barrel 17, and a supporting member 33 having a circular shape is fixed at the front of the fixed lens barrel block 12.

In the above-described embodiment of the zoom lens barrel 10, although the zoom lens optical system consists of two movable lens groups, namely the front lens group L1 and the rear lens group L2, it should be understood that the present invention is not limited to the present embodiment disclosed above, but the present invention may also be applied to another type of zoom lens optical system including one or more fixed lens groups.

In addition, in the above embodiment, the rear lens group L2 is supported on the AF/AE shutter unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Instead of adopting such a structure, the zoom lens barrel 10 may also be constructed in such a manner that the rear lens group L2 is not supported by the AF/AE shutter unit 21, which is provided with the shutter mounting stage 40, the circular driving member 49, the supporting member 47, the shutter blades 27, the shutter blade supporting ring 46 and the like, and that the rear lens group L2 is supported by any supporting member other than the AF/AE shutter unit 21.

The operation of the zoom lens barrel 10, by rotation of the whole optical unit driving motor 25 and the rear lens group driving motor 30, will now be described with reference to FIGS. 8 and 9.

Figure 9:
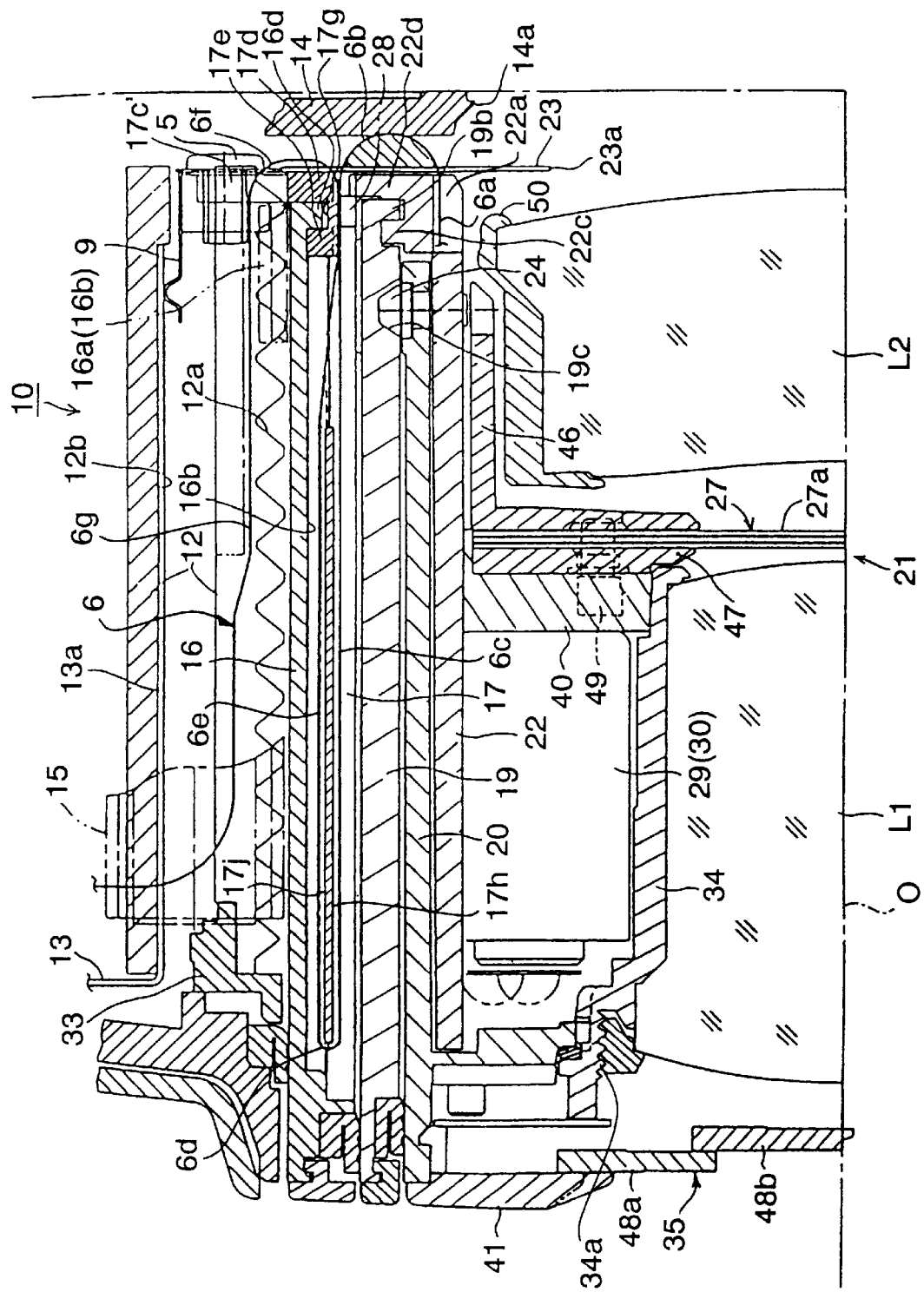
FIG. 9 is a sectional view of an upper part of the zoom lens barrel in a housed state.

As shown in FIG. 9, when the zoom lens barrel 10 is at the most retracted (withdrawn) position, i.e., the lens-housed condition. When the power switch is turned ON, the drive shaft of the whole optical unit driving motor 25 is driven to rotate in the forward rotational direction by a small amount. This rotation of the motor 25 is transmitted to the driving pinion 15 through a gear train 26, which is supported by a supporting member 32 integrally formed with the fixed lens barrel block 12, to rotate the third movable barrel 16 in one predetermined rotational direction to advance forwardly along the optical axis O. Therefore, the second movable barrel 19 and the first movable barrel 20 are each advanced by a small amount in the optical axis direction, along with the third movable barrel 16. Consequently, the camera is placed in a state capable of photographing, with the zoom lens positioned at the widest position, i.e., the wide end. In this state, the focal length may be detected in accordance with the amount of relative movement between the sliding movement of the code plate 13*a* and the contacting terminal 9 as the linear guide barrel 17 moves with respect to the fixed lens barrel block 12.

In the photographable state as above described, when the aforementioned zoom operating lever is manually moved towards a "tele" side, or the "tele" zoom button is manually depressed to be turned ON, the whole optical unit driving motor 25 is driven to rotate in the forward rotational direction through the whole optical unit driving motor controller 60. The rotation of the optical unit driving motor 25 causes the third movable barrel 16 to rotate in the rotational direction to advance along the optical axis O via the driving pinion 15 and the outer peripheral gear 16*b*. Therefore, the third movable barrel 16 is advanced from the fixed lens barrel block 12, according to the relationship between the female helicoid 12*a* and the male helicoid 16*a*. At the same time, the linear guide barrel 17 moves forwardly along the optical axis O together with the third movable barrel 16, without relatively rotating with respect to the fixed lens barrel block 12, and in accordance with the relationship between the engaging projections 17*c* and the linear guide grooves 12*b*. At this time, the simultaneous engagement of the follower pins 18 with the respective lead slots 17*b* and the linear guide grooves 16*c* causes the second movable barrel 19 to move forwardly relative to the third movable barrel 16 in the optical axis direction. In addition, the second movable barrel 10 rotates together with the third movable barrel 16 in the same rotational direction relative to the fixed lens barrel block 12. The first movable barrel 20 moves forwardly from the second movable barrel 19 along the optical axis O together with the AF/AE shutter unit 21, without relatively rotating with respect to the fixed lens barrel block 12 due to the above-noted structures in which the first movable barrel 20 is guided linearly by the linear guide member 22 and in which the follower pins 24 are guided by the lead grooves 19*c*. During such movements, according to the fact that the moving position of the linear guide barrel 17 with respect to the fixed lens barrel block 12 is detected through the relative slide between the code plate 13*a* and the contacting terminal 9, the focal length is detected.

Conversely, when the zoom operating lever is manually moved towards a "wide" side, or the "wide" zoom button is manually depressed to be turned ON, the whole optical unit driving motor 25 is driven to rotate in the reverse rotational direction by the whole optical unit driving motor controller 60, so that the third movable barrel 16 rotates in the rotational direction to retract into the fixed lens barrel block 12 together with the linear guide barrel 17. At the same time, the second movable barrel 19 is retracted into the third movable barrel 16 while rotating in the same direction as that of the third movable barrel 16, and the first movable barrel 20 is retracted into the rotating second movable barrel 19 together with the AF/AE shutter unit 21. During the above retraction driving, similar to the case of advancing driving as above described, the rear lens group driving motor 30 is not driven.

While the zoom lens barrel 10 is driven during the zooming operation, the front lens group L1 and the rear lens group L2 move as a whole, since the rear lens group driving motor 30 is not driven, which maintains a constant distance between the lens groups, as shown in FIG. 8. The focal length is input via the zoom code plate 13a and the contacting terminal 9 is indicated on an LCD panel (not shown) provided on the camera body.

At any focal length, when the release button is depressed by a half-step, the object distance measuring apparatus 64 is actuated to measure an object distance. At the same time, the photometering apparatus 65 is actuated to measure an object brightness. Thereafter, when the release button is fully depressed, the whole optical unit driving motor 25 and the rear lens group driving motor 30 are each driven by respective amounts each corresponding to the focal length information set in advance and the object distance information obtained from the object distance measuring apparatus 64, so that the front and rear lens groups L1 and L2 are respectively moved to specified positions to obtain a specified focal length and also to bring the object into focus. Immediately after the object is brought into focus, via the AE motor controller 66, the AE motor 29 is driven to rotate the circular driving member 49 by an amount corresponding to the object brightness information obtained from the photometering apparatus 65, so that the shutter 27 is driven to open the shutter blades 27a by a predetermined amount which satisfies the required exposure. Immediately after the three shutter blades 27a are opened and subsequently closed, the whole optical unit driving motor 25 and the rear lens group driving motor 30 are both driven to move the front lens group L1 and the rear lens group L2 to respective initial positions at which they were at prior to a shutter release.

An embodiment of the zoom compact camera having an exemplary flexible printed circuit board guiding structure will now be described with reference to FIGS. 8, 9 and 12–26.

Figure 12:
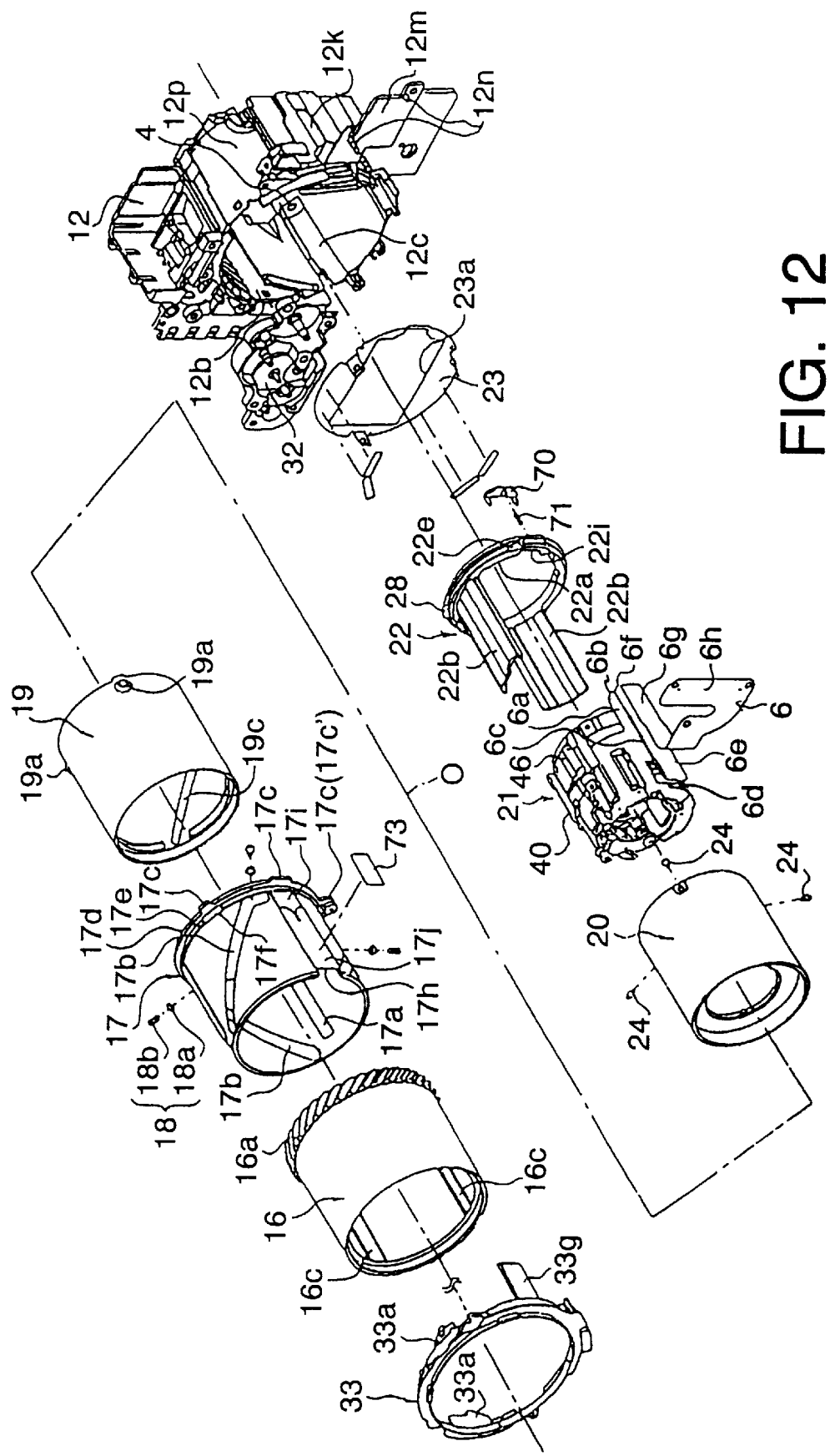
FIG. 12 is an exploded perspective view showing the major parts of the flexible printed circuit board guiding structure of the zoom lens barrel.
Figure 19:
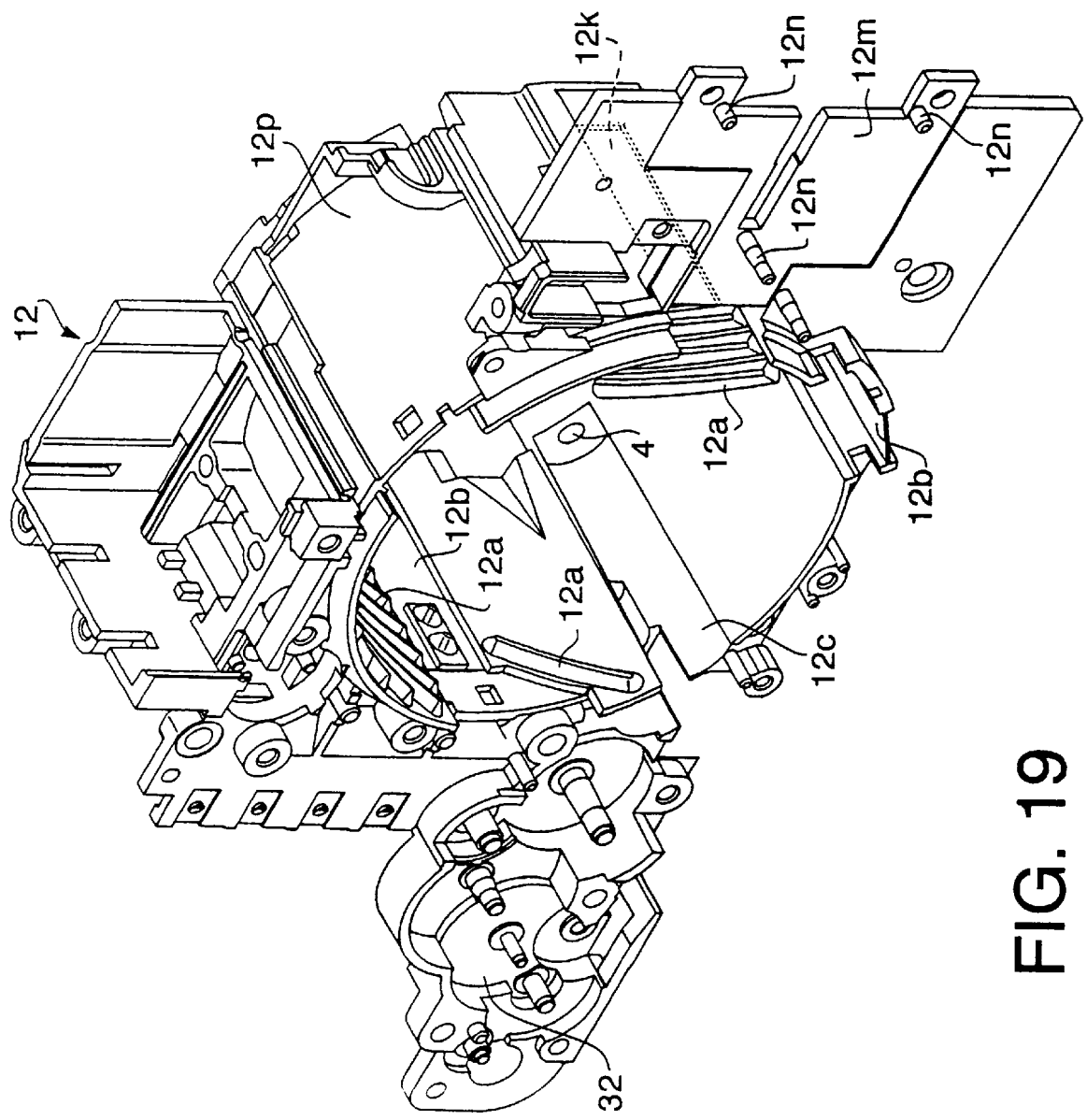
FIG. 19 is an external perspective view of the fixed lens barrel block of the zoom lens barrel.
Figure 20:
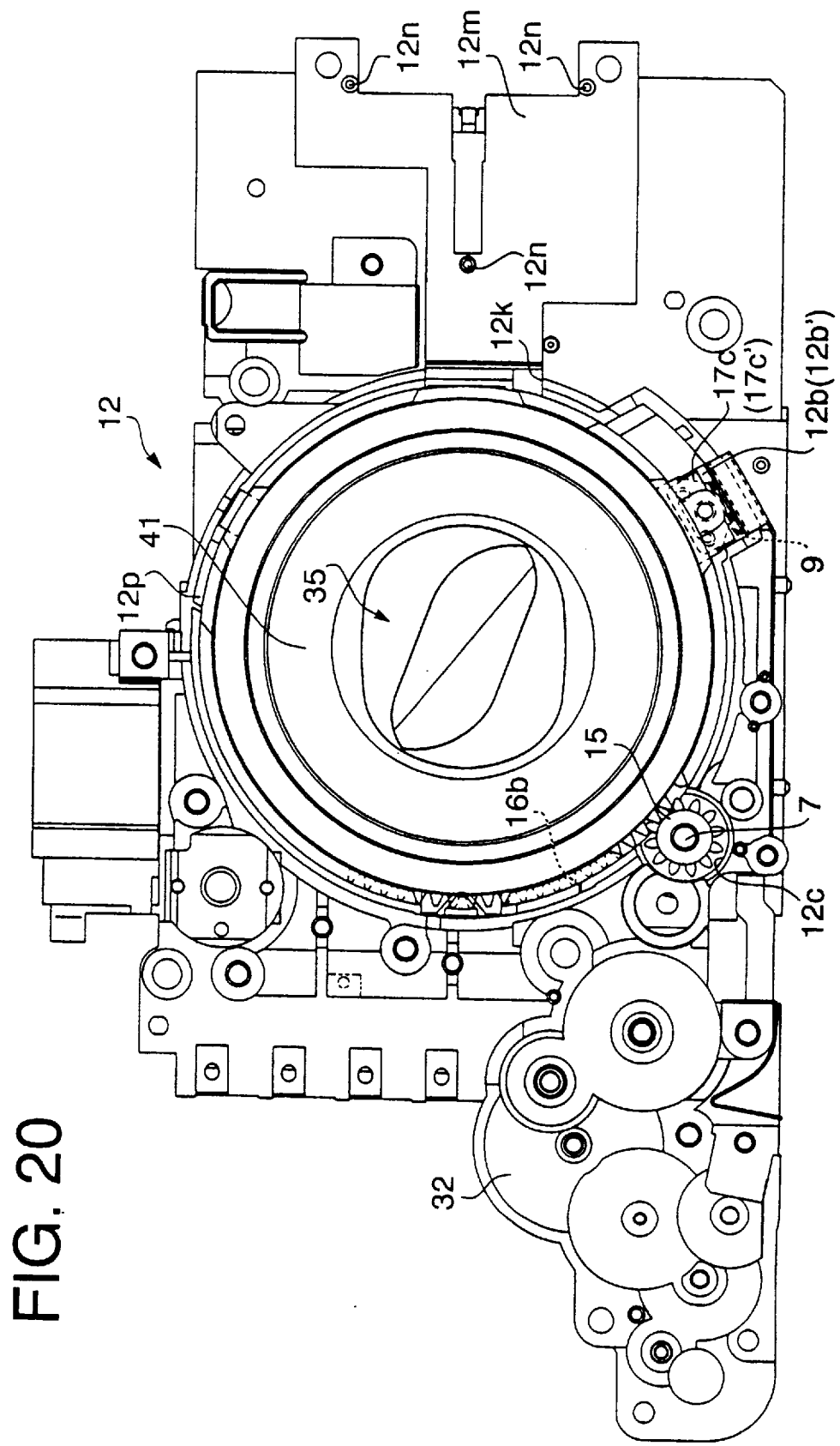
FIG. 20 is a front view of the fixed lens barrel block of the zoom lens barrel.

As shown in FIGS. 12 and 19, the fixed lens barrel block 12 is provided with a barrel portion 12p, an FPC fixing part 12m, and a supporting part 32. The supporting part 32 is formed on one side of the barrel portion 12p and the FPC fixing part 12m is formed on the other side, opposite the supporting part 32.

The supporting part 32 supports, at the rear thereof, the whole optical unit driving motor 25 and, at the front thereof, a gear train 26, comprised of a plurality of gears as shown in FIG. 10.

The FPC fixing part 12m is formed projecting sideways near the front of the barrel portion 12p. A flexible printed circuit board relief hole 12k (FPC relief hole) is formed on the barrel portion 12p to the rear of the FPC fixing part 12m. The FPC relief hole 12k is formed parallel to the optical axis O and is sufficiently large to allow the flexible printed circuit board 6 to protrude outward.

The fixing part 12m is provided with a plurality of fixing protrusions 12n and the flexible printed circuit board 6 is attached to the fixing part 12m by fitting a plurality of fixing holes 6i (see, for example, FIG. 15) to the plurality of fixing protrusions 12n.

The flexible printed circuit board 6 connects the AF/AE shutter unit 21 with a control unit 75 (see FIG. 8) that is mounted on the camera body. The control unit 75 includes, for example, a CPU (not shown), the AE motor controller 66, the whole optical unit driving motor controller 60, the rear lens group driving motor controller 61, the object distance measuring apparatus 64, and the photometering apparatus 65. The control unit 75 is also connected to, for example, the zoom operating device 62 and the focus operating device 63.

In order to guide the flexible printed circuit board 6, the rectilinear guide barrel 17 further includes, on its inner peripheral face, a flexible printed circuit board lead-in groove 17h (FPC lead-in groove), which runs parallel to the optical axis O and guides the flexible printed circuit board 6. The FPC lead-in groove 17h includes a through hole 17i that passes through the linear guide barrel 17 at the rear of the FPC lead-in groove 17h.

Figure 13:
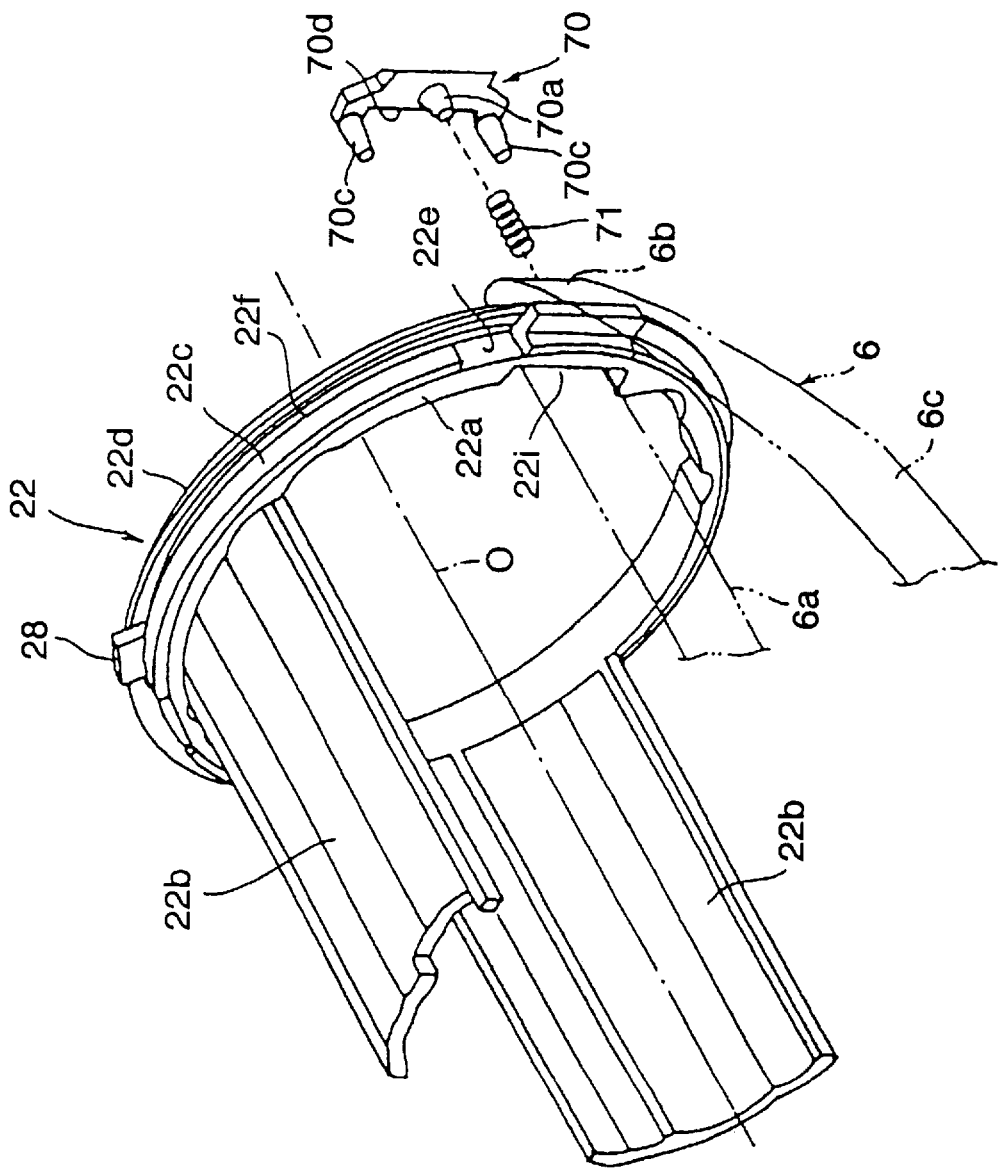
FIG. 13 is an enlarged perspective view showing the rectilinear guide member of the zoom lens barrel.
Figure 14:
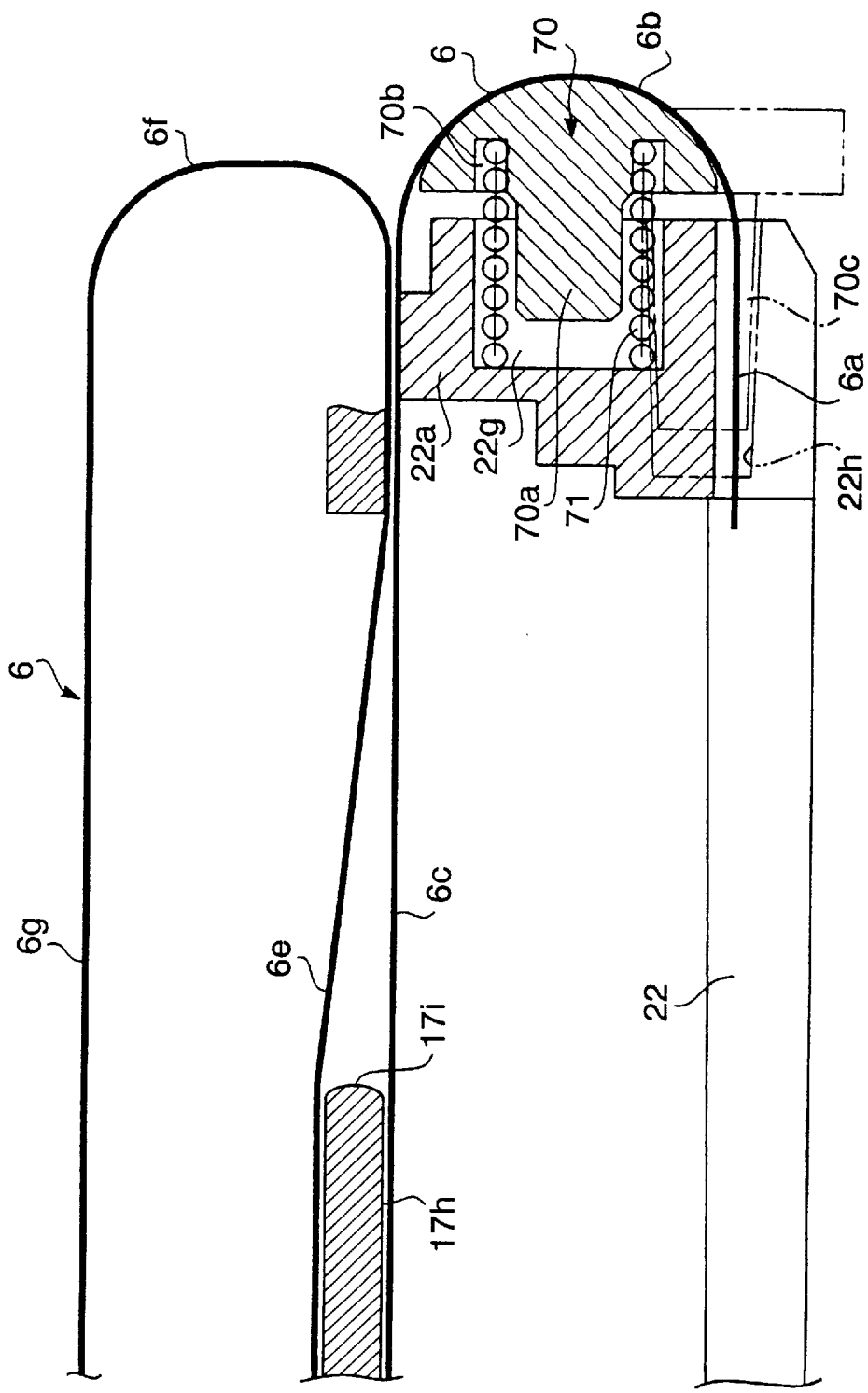
FIG. 14 is a cross-section showing a spring support at an end of the rectilinear guide member of the zoom lens barrel.
Figure 15:
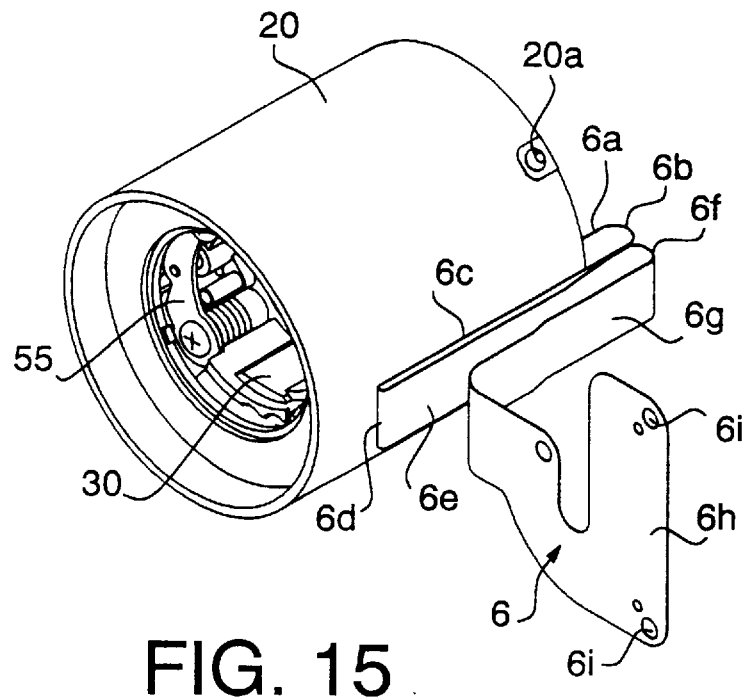
FIG. 15 is an external perspective view showing the condition of the flexible printed circuit board in relation to the first movable barrel.
Figure 16:
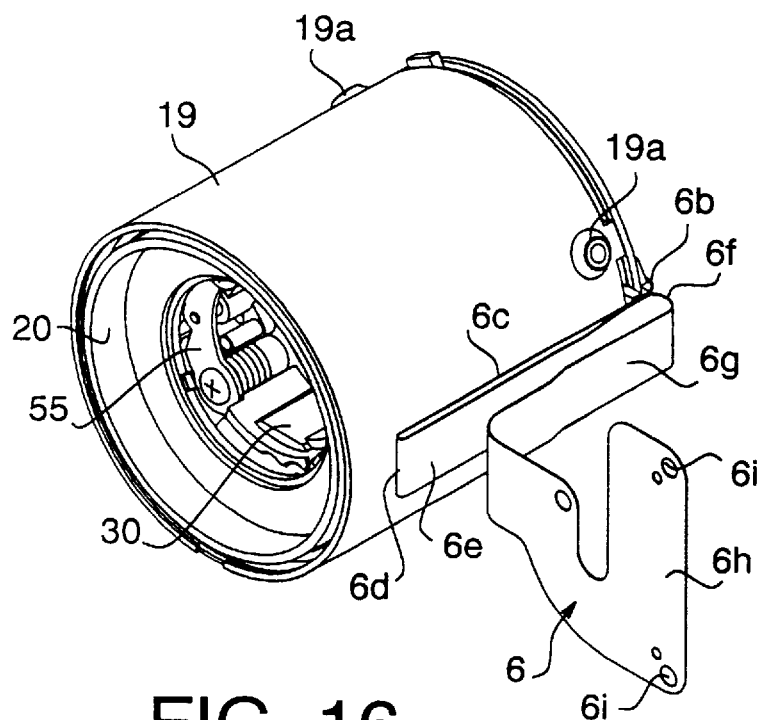
FIG. 16 is an external perspective view showing the condition of the flexible printed circuit board in relation to the second movable barrel.
Figure 17:
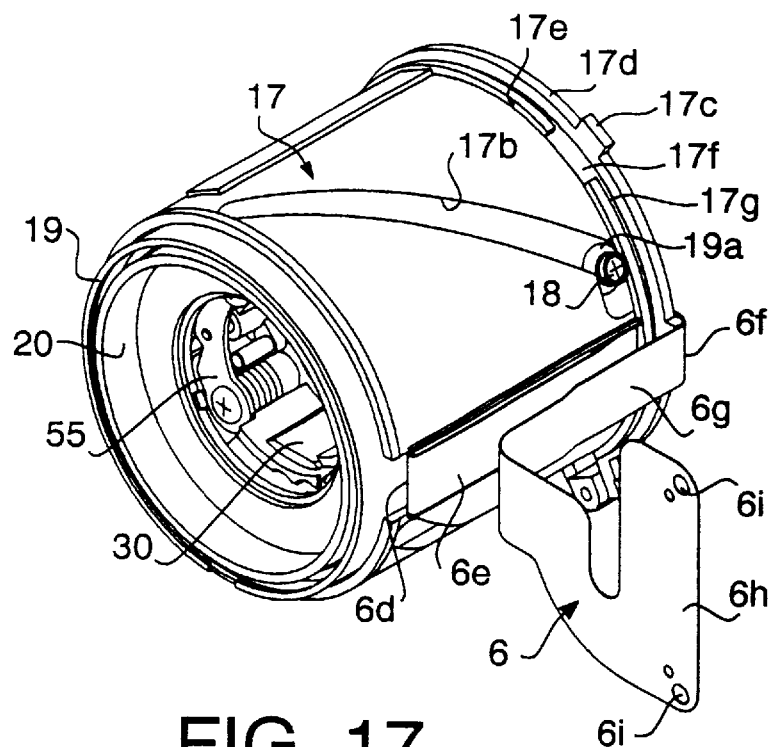
FIG. 17 is an external perspective view showing the condition of the flexible printer circuit board in relation to the rectilinear guide barrel.
Figure 18:
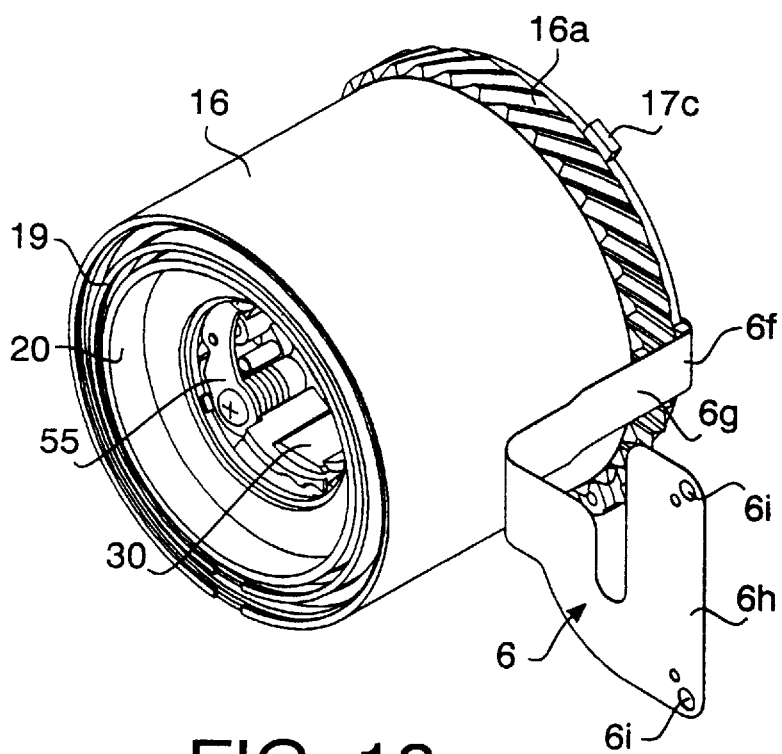
FIG. 18 is an external perspective view showing the condition of the flexible printed circuit board in relation to the third movable barrel.

Also, as shown in FIG. 13, the annular part 22a further includes a guide groove 22i, which allows the passage of, and rectilinearly guides, the flexible printed circuit board 6. In FIG. 13, the flexible printed circuit board is shown using phantom lines to show its position in the guide groove 22i.

Figure 21:
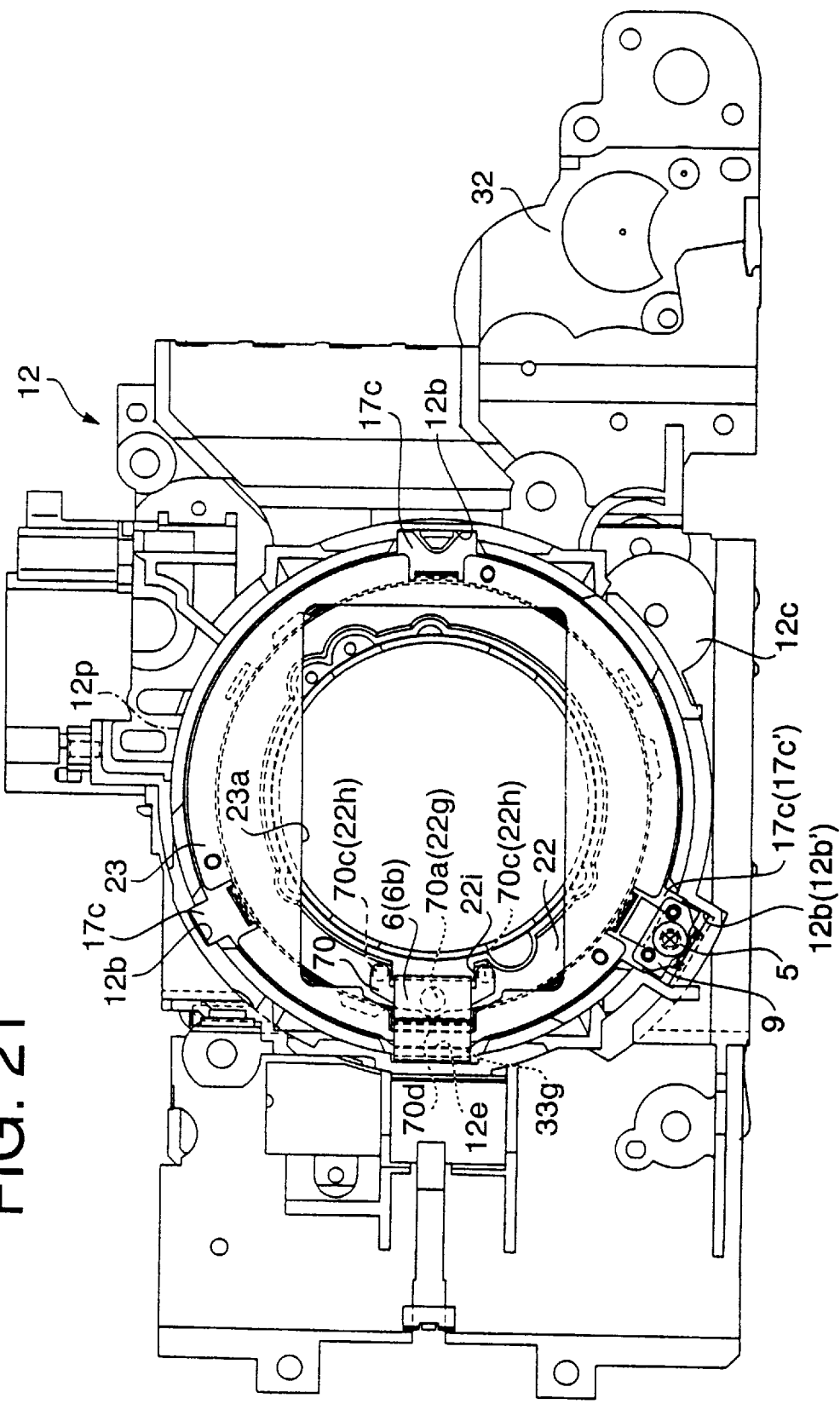
FIG. 21 is a rear view of the fixed lens barrel block of the zoom lens barrel.
Figure 22:
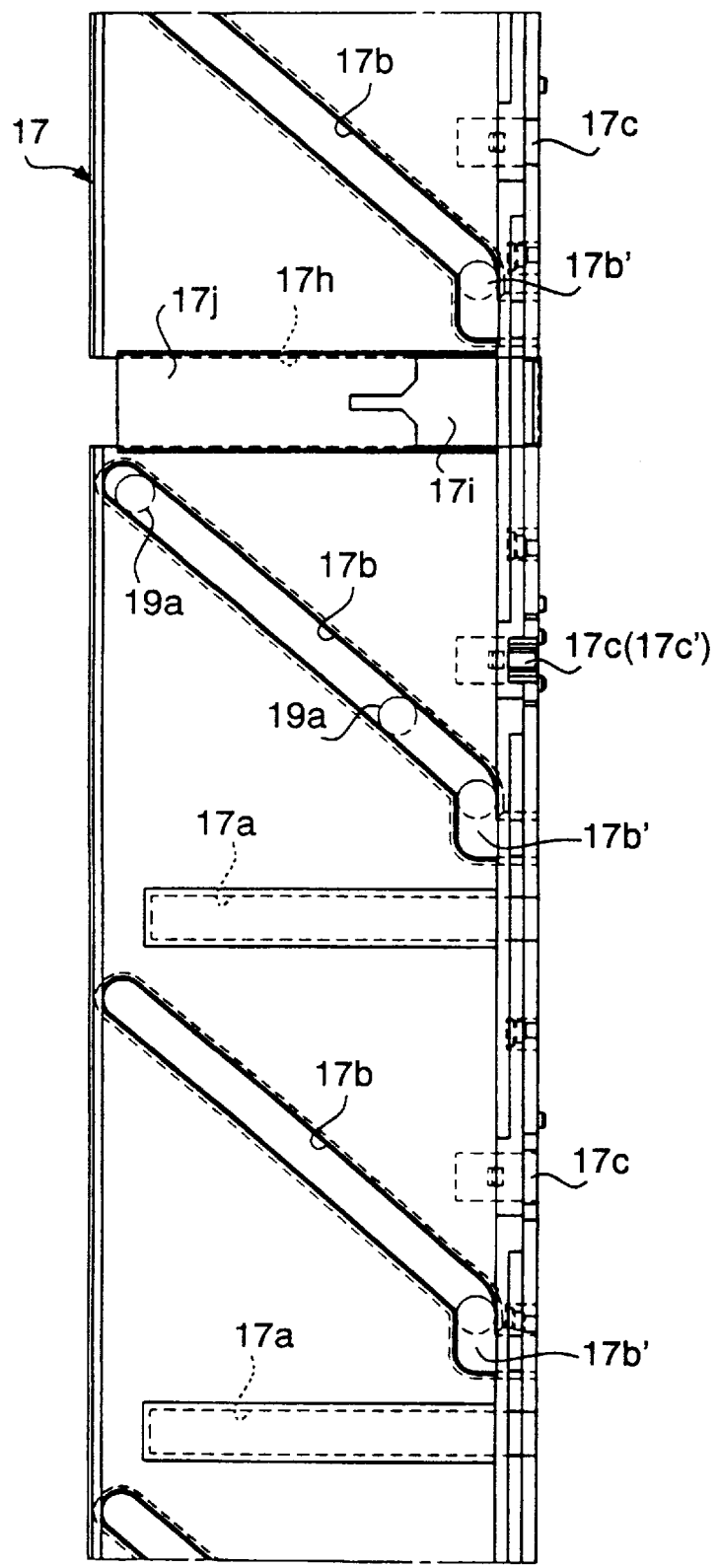
FIG. 22 is a development of the rectilinear guide barrel of the zoom lens barrel.
Figure 23:
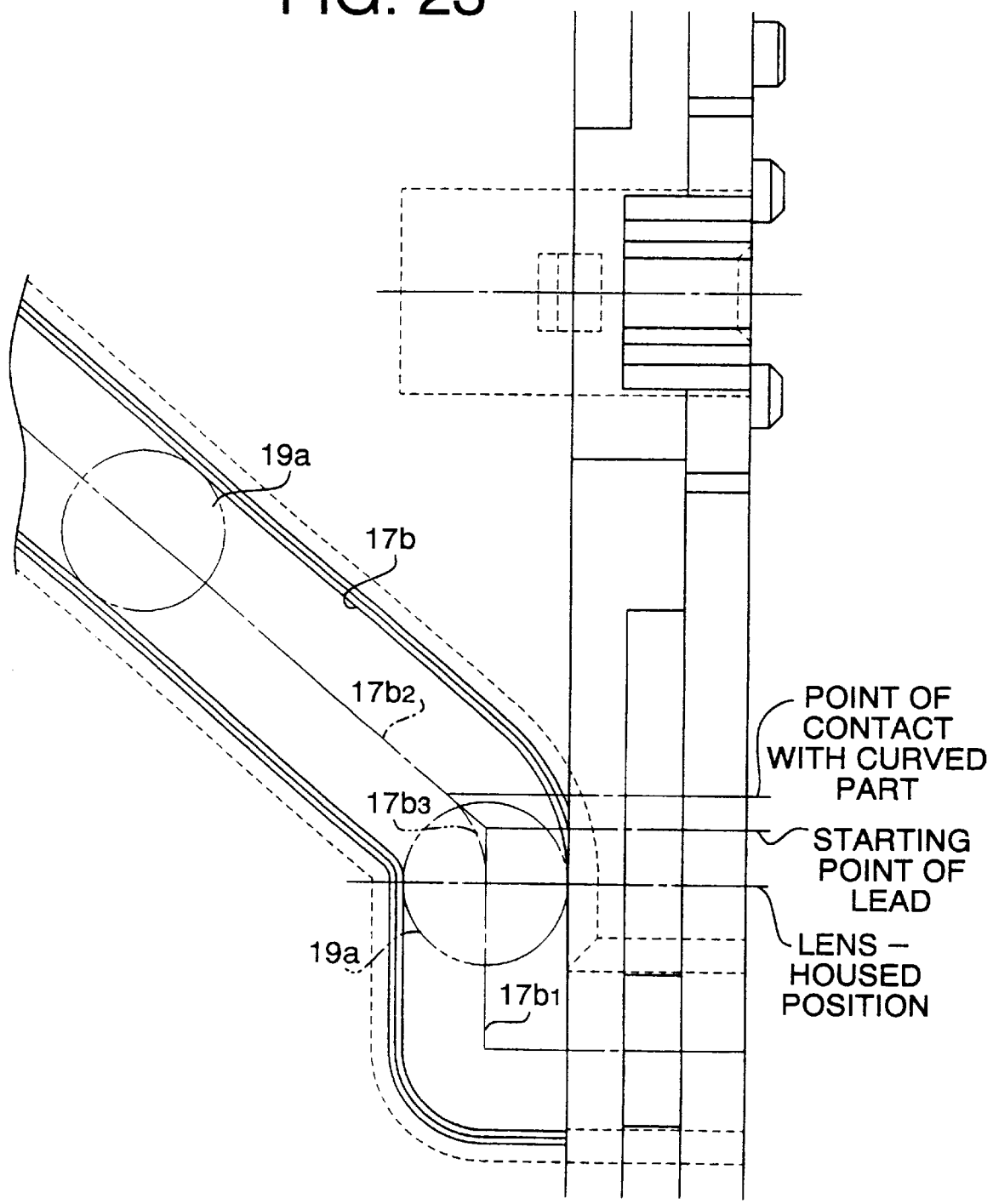
FIG. 23 is an enlarged development of major parts of the rectilinear guide barrel of the zoom lens barrel.
Figure 24:
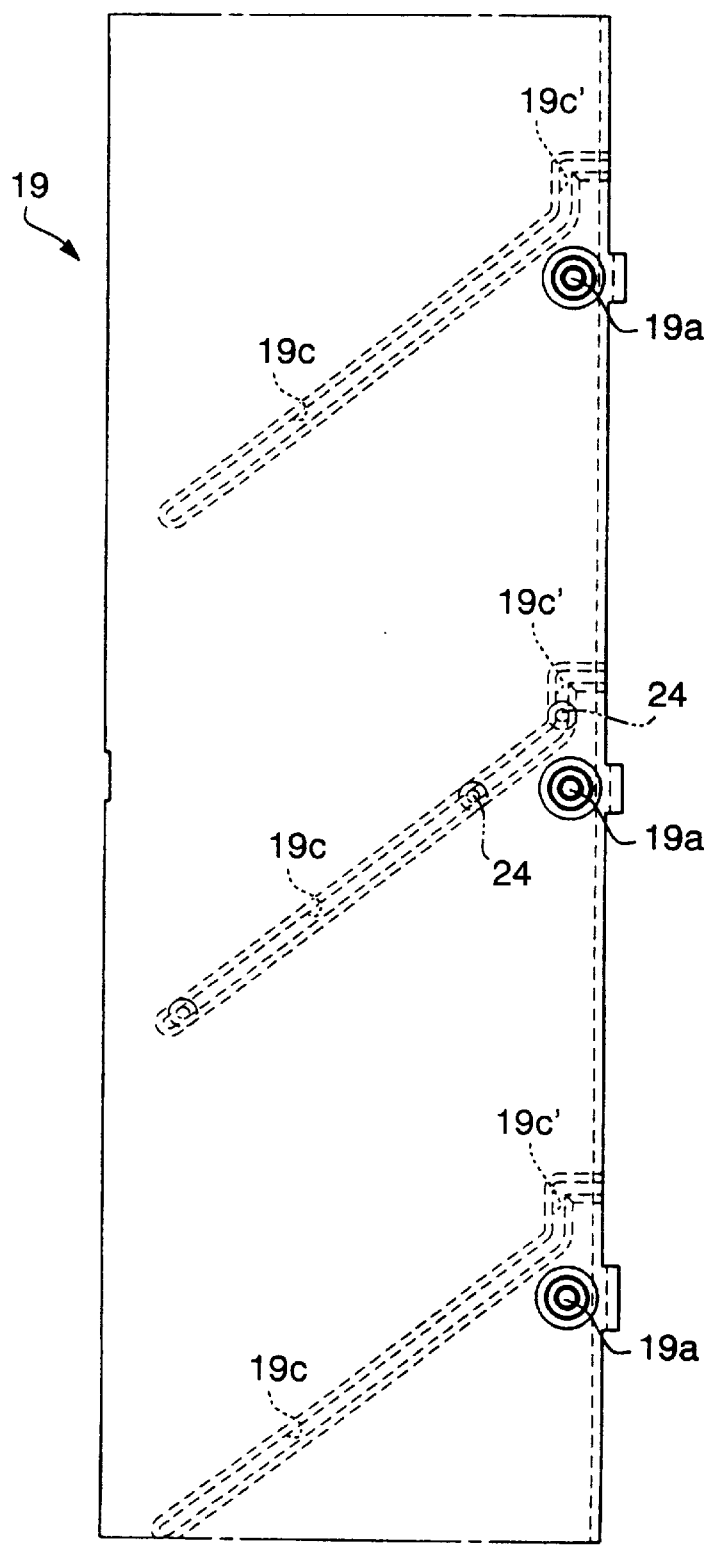
FIG. 24 is a development of the second movable barrel of the zoom lens barrel.
Figure 25:
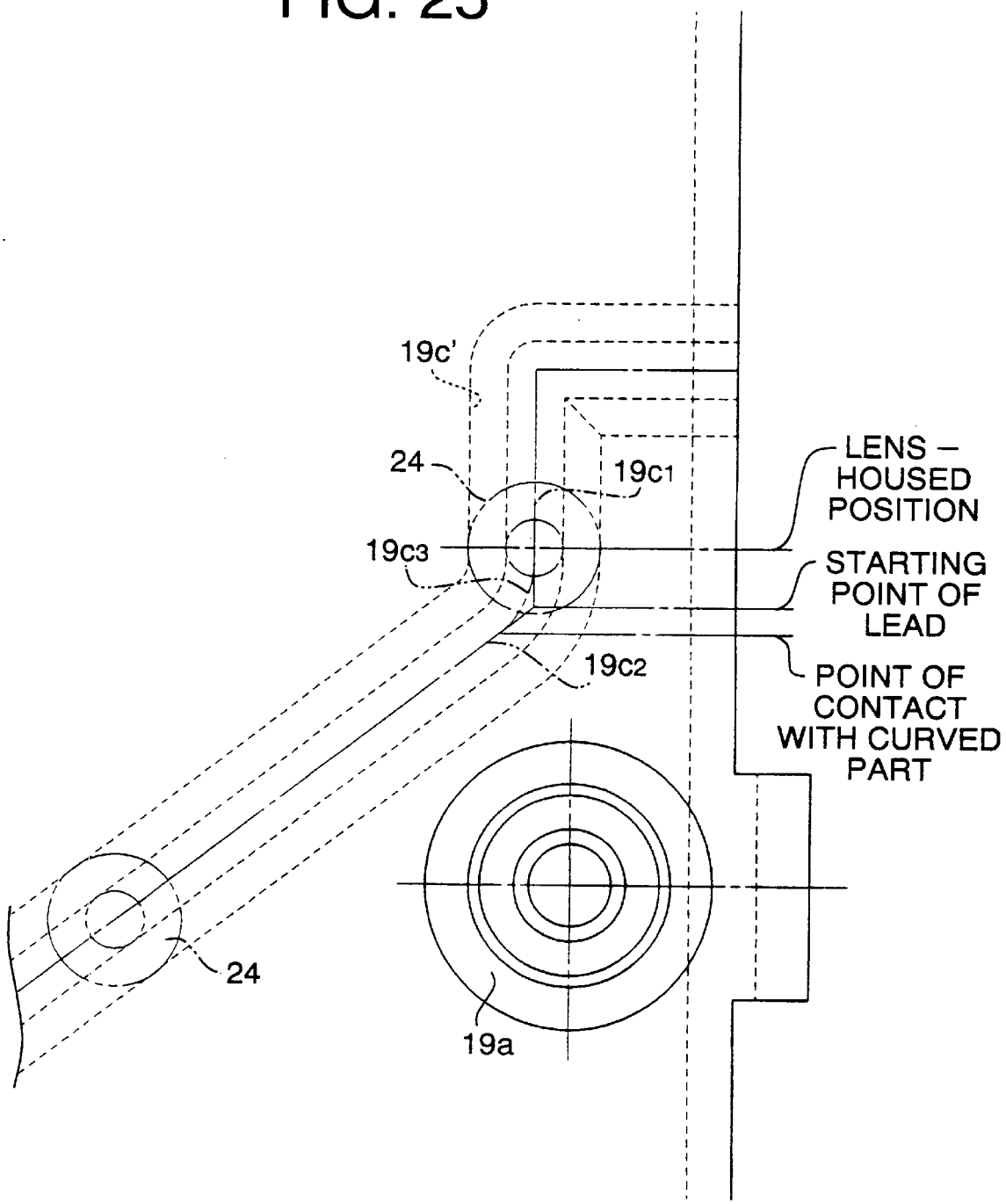
FIG. 25 is an enlarged development of major parts of the second movable barrel of the zoom lens barrel.

The annular part 22a also supports a spring support part 70, which resiliently supports the flexible printed circuit board 6. The spring support part 70 includes two guiding protrusions 70c, which protrude toward the front of the camera, a spring bearing protrusion 70a, which is positioned between the two guiding protrusions 70c, and a spring housing groove 70b, which is provided at the base of the spring bearing protrusion 70a. As shown in FIG. 21, the rear face of the linear guide member 22 includes two sliding support holes 22h and a spring hole 22g, which are positioned between the two sliding supporting holes 22h. The two guiding protrusions 70c are slidably fitted into the two sliding supporting holes 22h. A compression spring 71 is placed on the spring bearing protrusion 70a and is supported in the spring housing groove 70b. The spring bearing protrusion 70a is then inserted into the spring hole 22g and is compressed inside spring hole 22g. The spring support part 70 also includes a guide groove 70d that substantially coincides with the guide groove 22i when the spring bearing protrusion 70a is inserted into the spring hole 22g.

With the above arrangement, the spring support part 70 is positioned at the rear of the linear guide member 22 (i.e., the rear of the first movable barrel 20) such that the flexible printed circuit board 6 is resiliently supported in a direction parallel to the optical axis O.

The flexible printed circuit board 6 is defined as including a number of segments, as follows: a first rectilinear segment 6a, which extends from the AF/AE shutter unit 21 to the rear of the linear guide member 22; a first U-shaped segment 6b, which is formed by bending the flexible printed circuit board 6 forward over the spring support part 70 and inserting the flexible printed circuit board 6 into the guide groove 22i (see, for example, FIG. 13) at the rear of the rectilinear guide member 22; a second rectilinear segment 6c, which extends frontwardly along the FPC lead-in groove 17h; a second U-shaped segment 6d, which is formed by bending the flexible printed circuit board 6 toward the rear around the front end of the FPC lead-in groove 17h; a third rectilinear segment 6e, which extends rearward along an outer face 17j of the FPC lead-in groove 17h (inside the inner face of the third movable barrel 16) and, near the rear end of the rectilinear guide barrel 17, is lead to the inner face of the rectilinear guide barrel 17 via the through hole 17i; a third U-shaped segment 6f, which is formed to pass the flexible printed circuit board 6 through the FPC relief hole 12k of the fixed lens barrel block 12; a fourth rectilinear segment 6g, which extends from the third U-shaped segment 6f; and a fixed end segment 6h, which is fixed to the fixed part 12m at the outer side of the fixed lens barrel block 12 (see, in particular FIGS. 15–18).

Further, the flexible printed circuit board 6 is fixed with respect to the linear guide barrel 17 by securing the third rectilinear segment 6e to the outer face 17j of the linear guide barrel 17 by, for example, double-sided tape 73 (FIG. 12).

In other words, the flexible printed circuit board 6 is lead rearward from the AF/AE shutter unit 21 on the inner side of the second movable barrel 19, bent forward once at the rear end of the second movable barrel 19, lead forward inside the FPC lead-in groove 17h of the linear guide barrel 17, bent along the outer face 17j of the linear guide barrel 17 from the front end of the FPC lead-in guide groove 17h, adhered to the outer face 17j with the double-sided tape 73, guided again to the inner face of the rectilinear guide barrel 17 via the through hole 17i, and then bent out through the FPC relief hole 12k and attached to the fixing part 12m of the fixed lens barrel block 12.

The fixed end segment 6h of the flexible printed circuit board 6 is connected to the control unit 75 via a second flexible printed circuit board (not shown) to make the connection to the control unit 75 shown by a dotted line in FIG. 8.

As described above, the flexible printed circuit board 6 is bent at the front end of the FPC lead-in groove 17h and then lead along the outer face 17j of the rectilinear guide barrel 17 until lead into the inner face of the rectilinear guide barrel 17 via the through hole 17i. Since the flexible printed circuit board 6 is held in place and guided by the FPC lead-in groove 17h on the inner side of the linear guide barrel 17 and is prevented from moving radially on the outer face 17j of the linear guide barrel 17 because it is lead through the through hole 17i, the flexible printed circuit board 6 will not interfere with the follower pin 18, which moves in and is guided by the lead groove 17b or interfere with the movement of the second movable barrel 19 or the third movable barrel 16.

In the present embodiment, the relative amount and speed of movement of the first movable barrel 20 with respect to the second movable barrel 19 in the optical axis direction during zooming (advancing/retracting movement along the optical axis O) is set substantially equal to the relative amount and speed of movement of the second movable barrel 19 with respect to the third movable barrel 16. The substantial equality is achieved by setting the engaging relationship between the third movable barrel 16 and the fixed lens barrel block 12, the inclination (lead angle) of the lead groove 17b on the rectilinear guide barrel 17, and the inclination (lead angle) of the lead groove 19c on the second movable barrel 19. Note that, the third movable barrel 16 of this embodiment could also be a stationary portion, such as a housing for guiding the second movable barrel 19.

In particular, as a non-limiting exemplary arrangement of a preferred embodiment, the amount of lead of the lead groove 19c (i.e., the amount by which the first movable barrel 20 moves) is set to 124 mm and the amount of lead of the lead groove 17b (i.e., the amount by which the second movable barrel 19 moves) is set to 122.5 mm. As shown in FIGS. 22–25, the lead grooves 19c and 17b include linear portions with a fixed lead angle and slip groove parts 19c' and 17b' that are orthogonal to the optical axis O and that correspond to the lens accommodation position.

With the above arrangement, the respective amounts of extension of the first movable barrel 20 and the second movable barrel 19 are proportional to the amount of rotation of the third movable barrel 16 (and the speed of movement is proportional to the rotation speed of the whole optical unit driving motor 25). In both the linear guide barrel 17 and the second movable barrel 19, the lead starting points for extending the first movable barrel 20 and the second movable barrel 19 are hypothetical points at a position 3° from the lens-housed position when the follower protrusion 19a and the follower pin 24 are respectively positioned at the slip groove parts 17b' and 19c'.

The rectilinear guide barrel 17 does not rotate, but because the third movable barrel 16 does rotate, the relative rotation of the rectilinear guide barrel 17 with respect to third movable barrel 16, due to the action of the rectilinear guide groove 16c, shall be considered here.

In particular, the third movable barrel 16 is set to rotate by approximately 70° (i.e., 73° from the lens-housed position) in order to move the follower protrusion 19a and the follower pin 24 from the hypothetical starting points to the positions corresponding to the position at which the zoom lens is extended the most (tele end). Thus, the extension amount difference in the relative amounts of extension of the first movable barrel 20 and the second movable barrel 19, in the exemplary arrangement above, is:

$$(124-122.5) \times 70/360 \approx 0.3 \text{ (mm)}.$$

The extension amount difference is compensated for by the spring support part 70. In particular, since the first U-shaped segment 6b at the rear end of the second movable barrel 19 (and the linear guide member 22) is wound around the spring support part 70, the amount of compensating movement required by the spring support part 70 in the optical axis direction is half of the actual extension amount difference, that is, for the exemplary arrangement, 0.15 mm. Thus, when the first rectilinear segment 6a of the flexible printed circuit board 6 is pulled in the optical axis direction by the first movable barrel 20 by the above extension amount difference of 0.3 mm, the spring support part 70 is moved in the optical axis direction by 0.15 mm. That is, the spring support part 70, which is supported and urged rearward by the compression spring 71, is adjusted to allow movement by 0.15 mm forward in the optical axis direction. Over this distance, the percentage change in the urging force of the compression spring 71 is set to approximately 10%.

Figure 26:
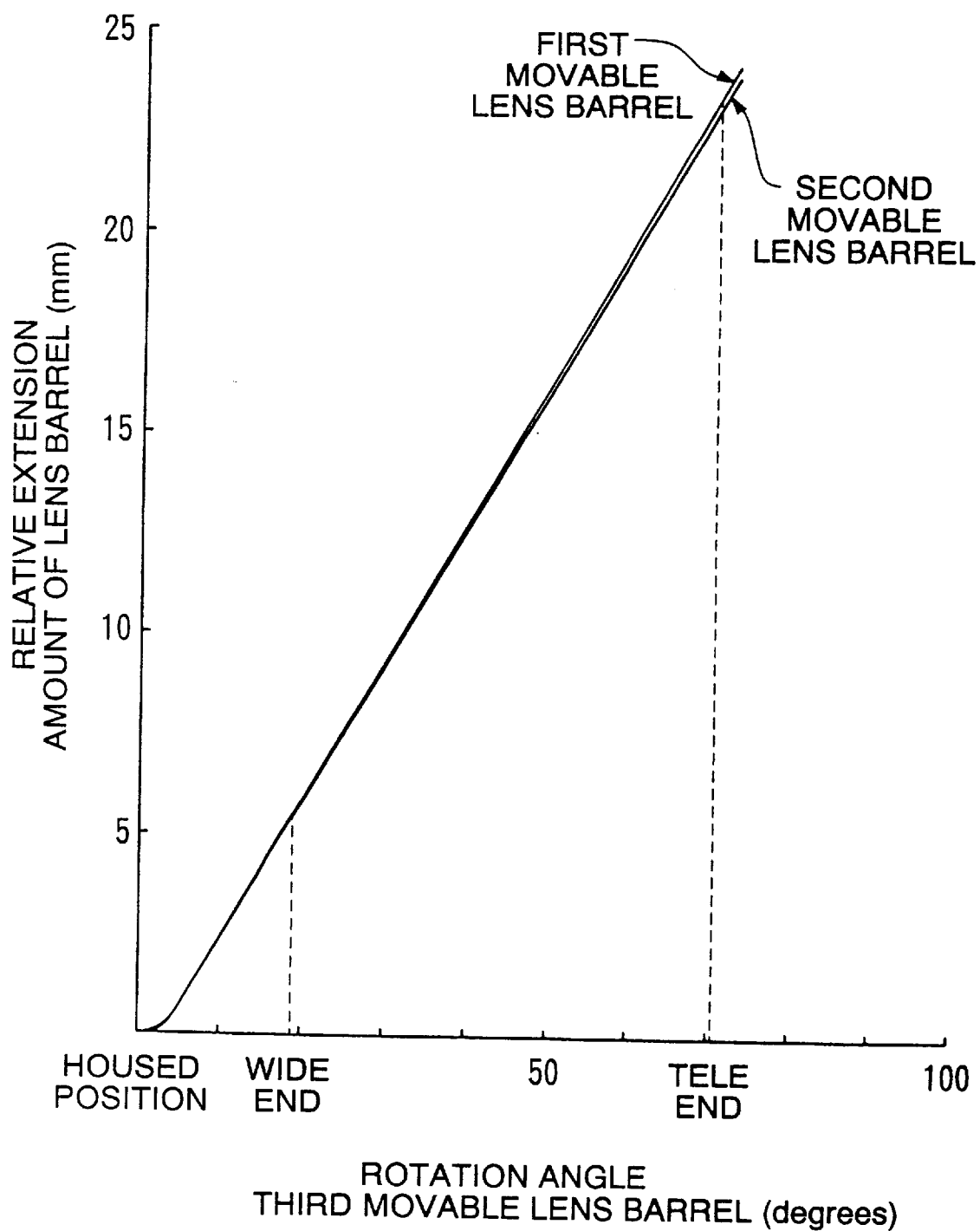
FIG. 26 is a graph showing the correlation between the rotation angle of the third movable barrel of the zoom lens barrel and the respective amounts of extensions of the first and second movable barrels of the zoom lens barrel.

FIG. 26 is a graph showing the relationship between the amount of rotation of the third movable barrel 16 and the relative amount of advance/retract (amount of extension) of the first movable barrel 20 with respect to the second movable barrel 19 and the relative amount of advance/retract (amount of extension) of the second movable barrel 19 with respect to the third movable barrel 16 for the exemplary arrangement. As can be seen in this graph, the respective advancing/retracting motions, along the optical axis O, of the first movable barrel 20 and the second movable barrel 19 vary linearly. In other words, other than in the range of 0°–3°, the respective amounts of movement of the first movable barrel 20 and the second movable barrel 19 are proportional to the amount of rotation of the third movable barrel 16. The range from 0°–3° corresponds to the movement from the lens-housed position to the lead starting points (discussed above, and shown in FIGS. 23 and 25, that is, the curved parts 19c3 and 17b3, which connect the respective horizontal parts 19c1 and 17b1 and the lead parts 19c2 and 17b2 of the lead grooves 19c and 17b). The point of transition from the curved part to the lead part corresponds to a rotation angle of 4.367° for the lead groove 19c and to a rotation angle of 4.848° for the lead groove 17b in the above example.

Since the first movable barrel 20 and the second movable barrel 19 are substantially equal with regard to the amount of extension for the same amount of rotation of the third movable barrel 16 (in other words, for the same time) and their respective advancing/retracting motions vary linearly, it can be understood that, during advance or retract (during zooming), the relative amount and speed of advance/retract along the optical axis O of the first movable barrel 20 with respect to the second movable barrel 19 is substantially equal to the relative amount and speed of advance/retract along the optical axis O of the second movable barrel 19 with respect to the third movable barrel 16. In the above, the term "substantially equal" means that the error between the relative amount and speed of the advance/retreat along the optical axis O of the first movable barrel 20 with respect to the second movable barrel 19, and the relative amount and speed of advance/retract along the optical axis O of the second movable barrel 19 with respect to the third movable barrel 16 is approximately ±0.3%.

As explained above, when the zoom lens barrel 10 is advanced or retracted, the relative movements of the first movable barrel 20 and of the second movable barrel movable barrel 19 prevent the slacking of the flexible printed circuit board 6. In particular, as shown in FIG. 9, initially, the first linear segment 6a is short, while the second linear segment 6c is long. During advance, the lengths of the first linear segment 6a and the second linear segment 6c vary proportionally, such that, at full extension, as shown in FIG. 8, the first linear segment 6a is long, while the second linear segment 6c is short. During this advance, the first U-shaped segment 6b remains in contact with the spring support part 70, and, as explained above, the spring support part 70 is resiliently mounted to compensate for any slacking of the flexible printed circuit board 6 that is not controlled by the relationship of the movements of the first movable barrel 20 and the second movable barrel 19. The process is reversed during retracting.

Thus, in the present embodiment of the zoom compact camera the slacking of the flexible printed circuit board 6 is prevented and a receiving part for receiving any slack is not needed allowing a more compact camera. Further, by the combination of the FPC lead-in groove 17h and the through hole 17i, the flexible printed circuit board 6 is held in position such that the flexible printed circuit board 6 does not affect the movement of the components of the camera.

Figure 27:
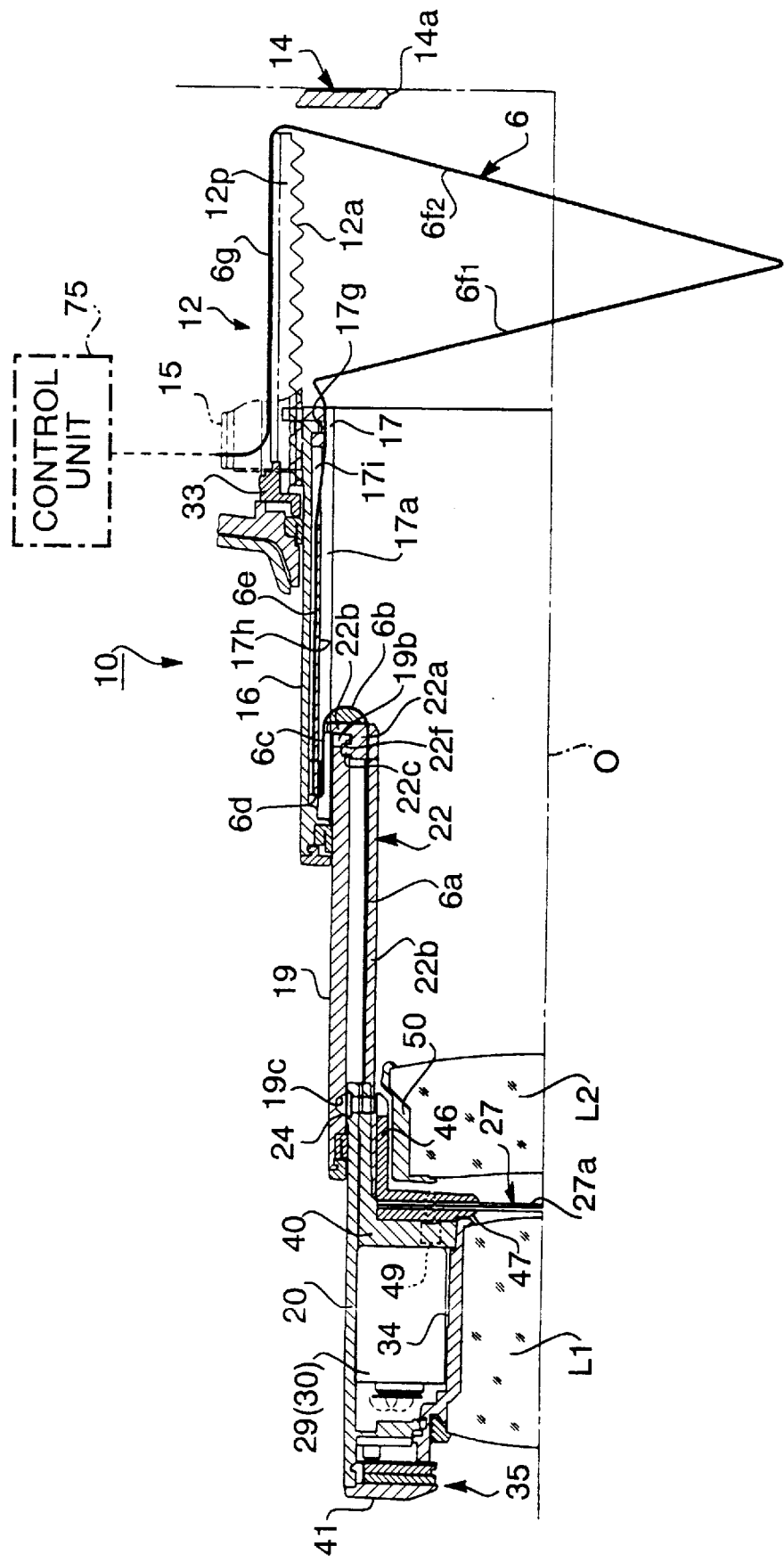
FIG. 27 is a sectional view of an upper part of the zoom lens barrel in a maximum extended state showing the flexible printed circuit board of the second embodiment.
Figure 28:
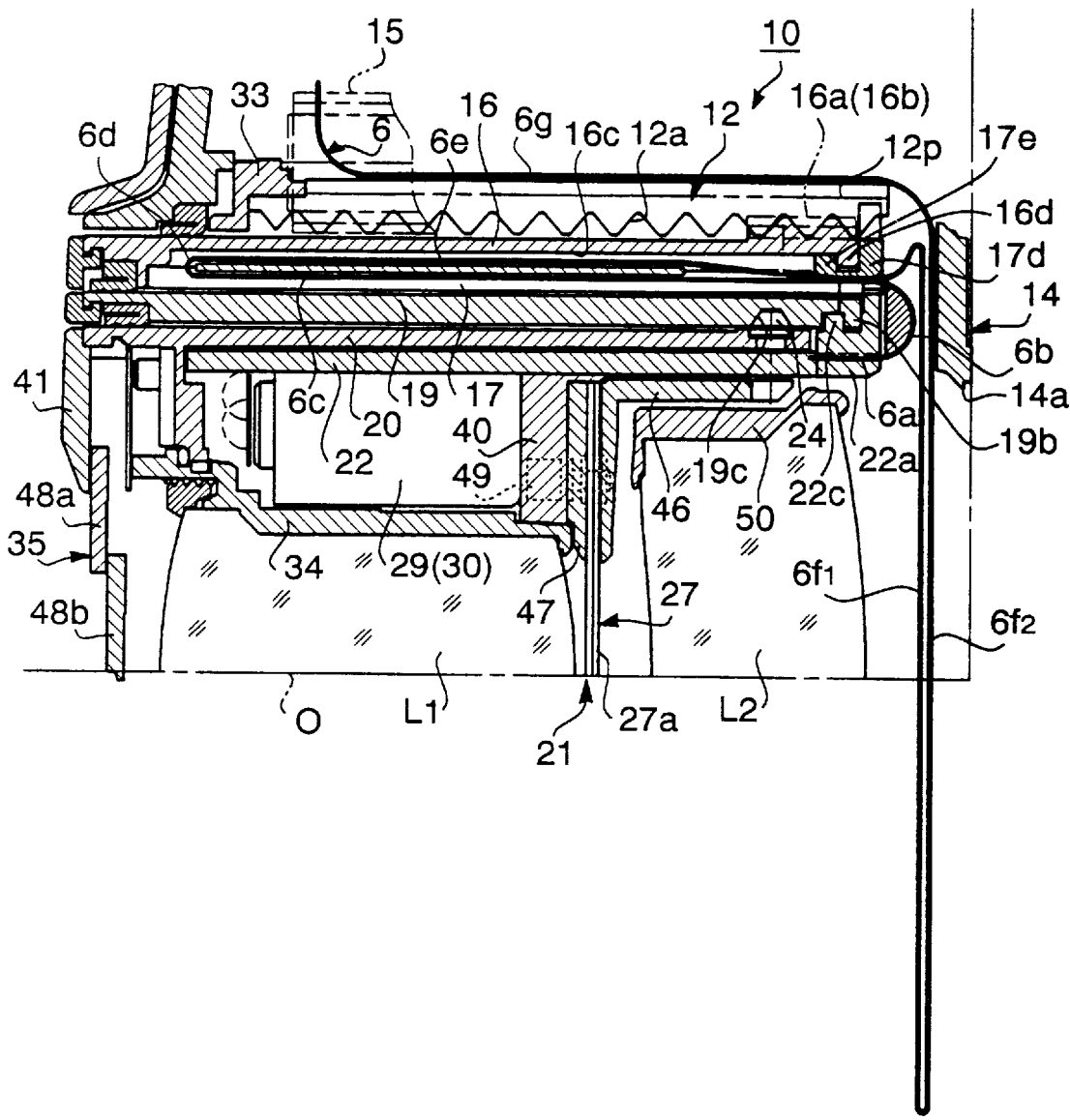
FIG. 28 is a sectional view of an upper part of the zoom lens barrel in a housed state showing the flexible printed circuit board of the second embodiment.

Another preferred embodiment of the zoom compact camera shall now be described with reference to FIGS. 27 and 28. In this embodiment, the flexible printed circuit board 6 can be described as including a number of segments including a first rectilinear segment 6a, which extends along the inner face of the second movable barrel 19 from the AF/AE shutter unit 21 mounted on the first movable barrel 20 to the rear of the linear guide member 22; a first U-shaped segment 6b, which is formed by bending the flexible printed circuit board 6 forward over the spring support part 70 and inserting the flexible printed circuit board 6 into the guide groove 22g at the rear of the rectilinear guide member 22 and the second movable barrel 19; a second rectilinear segment 6c, which extends frontwardly toward the inner face of the front end of the third movable barrel 16; a second U-shaped segment 6d, which is formed by bending the flexible printed circuit board 6 toward the rear around the front end of the FPC lead-in groove 17h on the linear guide barrel 17; a third rectilinear segment 6e, which extends rearward along the outer face 17j of the FPC lead-in groove 17h (the inner face of the third movable barrel 16) toward the camera body, and is lead to the inner face of the rectilinear guide barrel 17 via the through hole 17i; a pair of annular segments 6f1 and 6f2 described in detail below; a fourth rectilinear segment 6g, which extends from the annular segment 6f2 along the exterior of the fixed lens barrel block 12; and a fixed end segment 6h, which is fixed to the fixed part 12m at the outer side of the fixed lens barrel block 12.

As in the previous embodiment, the flexible printed circuit board 6 is fixed to the outer face 17j of the linear guide barrel 17 by the double-coated tape 73. Also, the fixed end segment 6h of the flexible printed circuit board 6 is connected to the control unit 75 via a second flexible printed circuit board (not shown).

Figure 29:
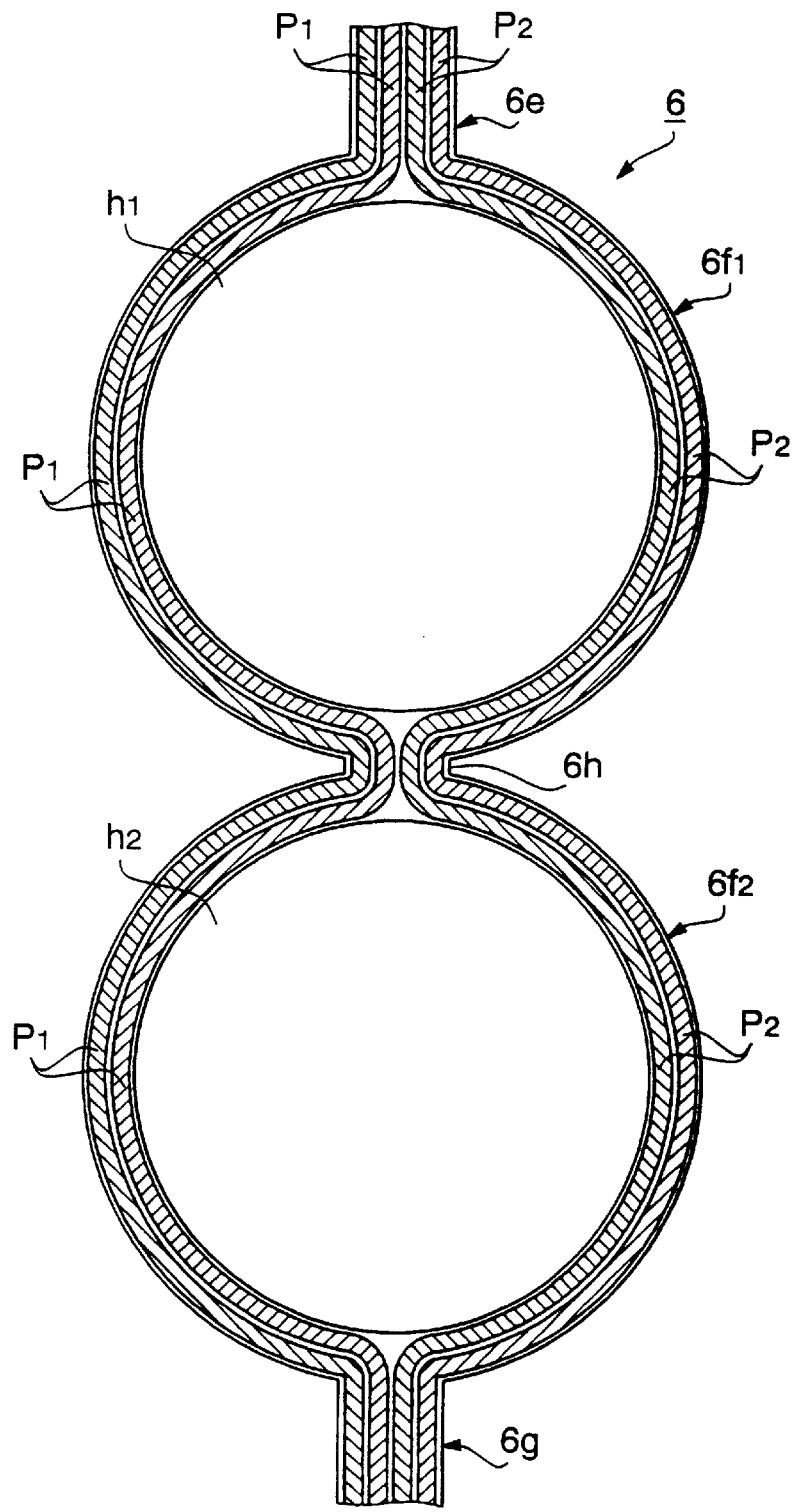
FIG. 29 is a plan view of the flexible printed circuit board of the second embodiment.
Figure 30:
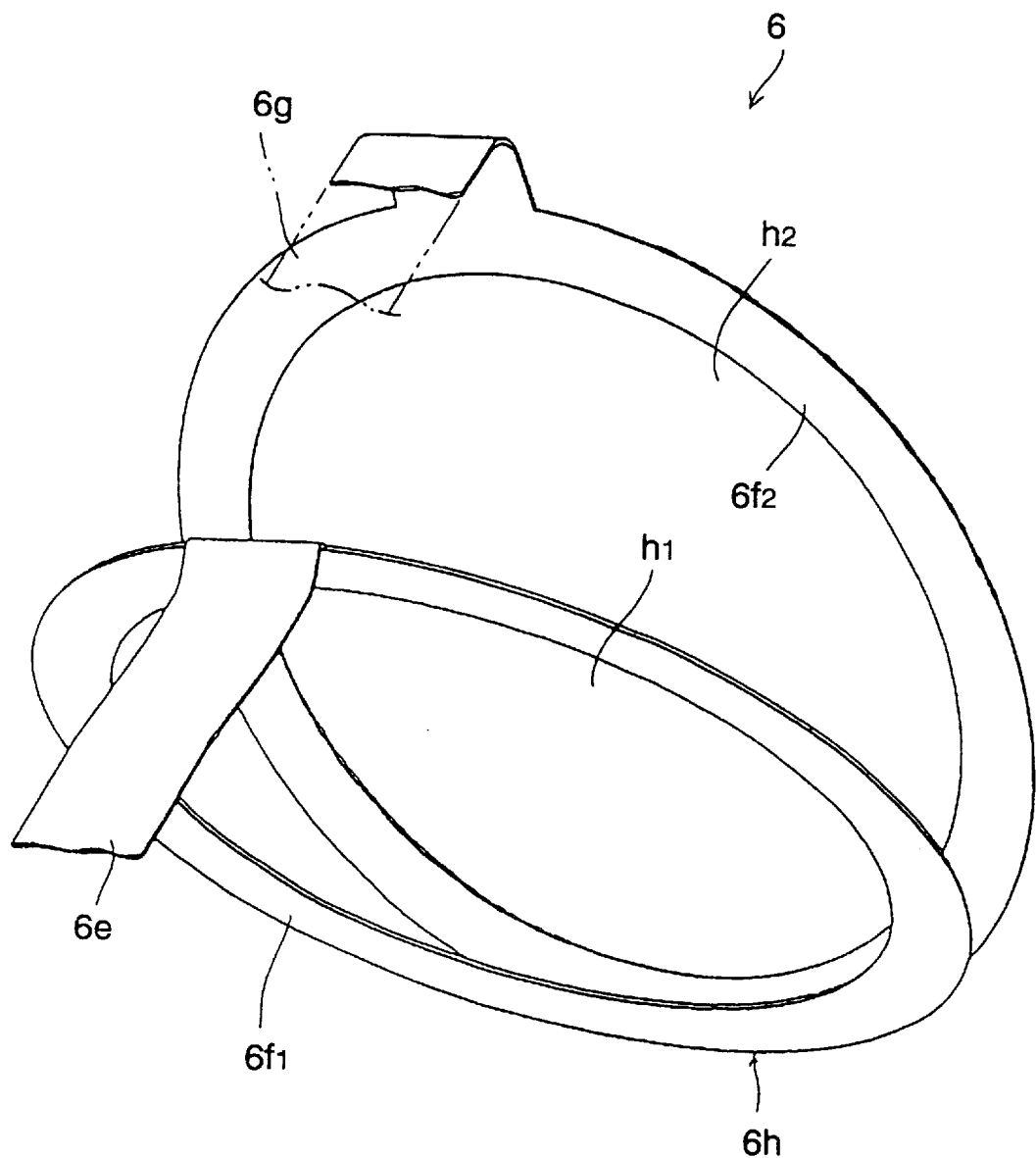
FIG. 30 is a perspective view of the flexible printed circuit board of the second embodiment.

In particular, the annular segments 6f1 and 6f2 define holes h1 and h2 which allow the passage of the photographing light (the light of the photographing optical system). As shown in FIGS. 29 and 30, the annular segments 6f1 and 6f2 form a "spectacle-like" form in the unfolded condition and are foldable at the middle at a joining segment 6i. The annular segment 6f1 is attached to the third rectilinear segment 6e and the annular segment 6f2 is attached to the fourth rectilinear segment 6g. In particular, the annular segment 6f2 attaches to the fourth rectilinear segment 6g through a gap between the rear end of the fixed lens barrel block 12 and the aperture plate 14, such that the through hole 12k described for the first embodiment is not required.

If, for example, the flexible printed circuit board 6 is further provided with circuit patterns P1 and P2 (shown in FIG. 29), which continue over the whole length of the flexible printed circuit board 6 (not shown), the patterns P1 and P2 can be split to the left and right sides of the annular segments 6f1 and 6f2 as shown in FIG. 29. The arrangement of the annular segments 6f1 and 6f2 in this manner provides a structure which expands and retracts between a closed position as shown in FIG. 28 and an opened position as shown in FIG. 27. That is, the annular segments 6f1 and 6f2 extend and retract in a bellows-like manner (when viewed from the side of the zoom lens barrel 10) as the first movable barrel 20 advances and retracts along the optical axis O. In particular, the use of a combination of circuit patterns P1 and P2 allows the widths (i.e., difference between outer diameters and inner diameters) of the annular segments 6f1 and 6f2 to be smaller than the width of the other segments of the flexible printed circuit board 6, and, in particular, smaller than the width of a single flexible printed circuit board arranged in a spiral manner, thus, taking less space within the camera. Furthermore, since the photographing light passes through the holes h1 and h2 of the annular parts 6f1 and 6f2, both adverse light rays at the edges of the photographing light beam and internal reflection will be reduced.

Although the structure and operation of a zoom compact camera is described herein with respect to the preferred embodiments and exemplary structures, many modifications and changes can be made without departing from the spirit and scope of the invention.

The present disclosure relates to subject matter contained in Japanese Patent Application Nos. HEI 08-012317, filed on Jan. 26, 1997, HEI 08-027132, filed on Feb. 14, 1996, HEI 08-027133, filed on Feb. 14, 1996, and HEI 08-057878, filed on Mar. 14, 1996, which are expressly incorporated herein by reference in their entirety.

What is claimed is:

1. A zoom compact camera comprising:
   a camera body;
   a first movable barrel;
   an electrical unit mounted on said first movable barrel;
   a second movable barrel;
   a housing for guiding said second movable barrel; and
   a flexible printed circuit board for connecting said electrical unit with a control unit in said camera body;
   wherein said first movable barrel and said second movable barrel are concentrically arranged to telescope during zooming;
   wherein said flexible printed circuit board extends with a predetermined length from said electrical unit around a rear end of said second movable barrel to the front of said housing; and
   wherein during movement of said first movable barrel and said second movable barrel along the optical axis, the relative amount and speed of movement of said first movable barrel with respect to said second movable barrel are substantially equal to the relative amount and speed of movement of said second movable barrel with respect to said housing.

2. The camera according to claim 1, further comprising a spring support, said spring support disposed at the rear end of said second movable barrel such that said spring support supports said flexible printed circuit board and urges said flexible printed circuit board rearward.

3. The camera according to claim 1, said housing comprising a third movable barrel.

4. The camera according to claim 3, wherein said second movable barrel houses a linear guide member that integrally moves with said second movable barrel along the optical axis, said linear guide member supporting a spring support, and said spring support is disposed at the rear end of said linear guide member such that said spring support supports said flexible printed circuit board and urges said flexible printed circuit board rearward.

5. The camera according to claim 4, wherein said third movable barrel houses a linear guide barrel that integrally moves with said third movable barrel along the optical axis, and wherein an inner face of said linear guide barrel is provided with a lead-in groove, said lead-in groove extending parallel to the optical axis for receiving said flexible printed circuit board.

6. The camera according to claim 1, wherein the movement speeds of the first movable barrel and the second movable barrel are respectively varied in a linear manner.

7. The camera according to claim 1, wherein said flexible printed circuit board is secured proximate to the front of said housing.

8. The camera according to claim 7, wherein said flexible printed circuit board is secured proximate to the front of said housing by double-sided tape.

9. A zoom compact camera comprising:
   a camera body;
   a first movable barrel;
   an electrical unit mounted on said first movable barrel;
   a second movable barrel;
   a third movable barrel;
   a linear guide barrel that integrally moves with said third movable barrel along the optical axis; and
   a flexible printed circuit board for connecting said electrical unit with a control unit in said camera body;
   wherein said first movable barrel, said second movable barrel, and said third movable barrel are concentrically arranged and extend during zooming;
   wherein a lead-in groove is formed on an inner face of said linear guide barrel parallel to the optical axis and a rear part of said lead-in groove has a through hole formed therein; and
   wherein a portion of said flexible printed circuit board extends around a rear end of said second movable barrel, extends forwardly inside said lead-in groove, extends around a front of said lead-in groove, extends rearwardly along an outer face of said linear guide barrel, and extends through said through hole to the inner face of said linear guide barrel.

10. The camera according to claim 9, wherein said second movable barrel houses a linear guide member that integrally moves with said second movable barrel along the optical axis, said linear guide member supporting a spring support, and said spring support is disposed at the rear end of said linear guide member such that said spring support supports said flexible printed circuit board and urges said flexible printed circuit board rearward.

11. The camera according to claim 10, wherein said lead-in groove receives said flexible printed circuit board during zooming.

12. The camera according to claim 9, wherein the relative amount and speed of movement along the optical axis of said first movable barrel with respect to said second movable barrel are substantially equal to the relative amount and speed of movement along the optical axis of said second movable barrel with respect to said third movable barrel.

13. The camera according to claim 12, wherein the moving speeds of said first movable barrel and said second movable barrel are respectively varied in a linear manner.

14. The camera according to claim 9, wherein said flexible printed circuit board is fixed to said outer face of said rectilinear barrel by double-sided tape.

15. A zoom compact camera comprising:
   a camera body;
   a first movable barrel;
   an electrical unit mounted on said first movable barrel;
   a second movable barrel;
   a linear guide member that integrally moves with the second movable barrel along the optical axis;
   a third movable barrel;
   a linear guide barrel that integrally moves with said third movable barrel along the optical axis;
   a housing that guides said linear guide barrel; and
   a flexible printed circuit board for connecting said electrical unit with a control unit in said camera body;
   wherein said first movable barrel, said second movable barrel, and said third movable barrel are concentrically arranged and extend during zooming;
   wherein a lead-in groove is formed on an inner face of said linear guide barrel parallel to the optical axis and said lead-in groove has a through hole formed at a rear part thereof; and
   wherein a portion of said flexible printed circuit board extends from said control unit through a relief hole in said housing unit, extends between said third movable barrel and said linear guide barrel to be secured proximate the front of said linear guide barrel, extends around a front end of said lead-in groove, extends rearward between said linear guide barrel and said second movable barrel along said lead-in groove, extends around a rear end of said second movable barrel and said linear guide member, and extends forward to said electrical unit.

16. The camera according to claim 15, wherein the relative amount and speed of movement along the optical axis of said first movable barrel with respect to said second movable barrel are substantially equal to the relative amount and speed of movement along the optical axis of said second movable barrel with respect to said third movable barrel.

17. The camera according to claim 16, wherein the moving speeds of said first movable barrel and said second movable barrel are respectively varied in a linear manner.

18. The camera according to claim 15, wherein said flexible printed circuit board is fixed to the outer face of said second rectilinear barrel by double-sided tape.

19. A zoom compact camera comprising:
   a camera body;
   a movable lens barrel;
   a shutter unit;
   a fixed lens barrel which supports said movable lens barrel in a manner enabling movement of said lens barrel along the optical axis; and
   a flexible printed circuit board for providing an electrical link between said shutter unit and a control unit in said camera body;
   wherein said flexible printed circuit board has at least one annular ring portion with a predetermined inner diameter and further comprises two annular rings that have an electrical connection at a circumferential edge.

20. The camera according to claim 19, wherein the distance, parallel to the optical axis, between said two annular rings at a position opposite said electrical connection can be varied.

21. A zoom compact camera comprising:
   a movable lens barrel that is movable along the optical axis;
   an electrical unit that is mounted on said movable lens barrel;
   a control unit; and
   a flexible printed circuit board electrically connecting said electrical unit to said control unit;
   wherein said flexible printed circuit board comprises a first rectilinear portion, an annular portion that includes at least one annular ring, and a second rectilinear portion; and
   wherein said first rectilinear portion extends between said electrical unit and said annular portion and said second rectilinear portion extends between said annular portion and said control unit.

22. The camera according to claim 21,
   wherein said annular portion includes two annular rings having an electrical connection at a first position at a circumferential edge thereof; and
   wherein said first rectilinear portion has an electrical connection to one of said two annular rings at a second position opposite to said first position, and said second rectilinear portion has an electrical connection to another of said two annular rings at a corresponding third position on said another of said two annular rings.

* * * * *